United States Patent
Kaida et al.

(10) Patent No.: US 6,774,729 B2
(45) Date of Patent: Aug. 10, 2004

(54) COMPOSITE-MATERIAL VIBRATING DEVICE

(75) Inventors: Hiroaki Kaida, Moriyama (JP); Jiro Inoue, Omihachiman (JP); Toshio Nishimura, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/434,229

(22) Filed: May 9, 2003

(65) Prior Publication Data

US 2003/0218517 A1 Nov. 27, 2003

(30) Foreign Application Priority Data

May 21, 2002 (JP) ...................................... 2002-146477
May 21, 2002 (JP) ...................................... 2002-146479

(51) Int. Cl.[7] ............................ H03H 9/56; H01L 41/04
(52) U.S. Cl. ...................................... 330/364; 333/188
(58) Field of Search .................................. 333/188, 191, 333/133, 186, 187, 189, 190, 196; 310/364, 358

(56) References Cited

U.S. PATENT DOCUMENTS 6,583,688 B2 * 6/2003 Klee et al. .................. 333/188
6,717,335 B2 * 4/2004 Nishimura et al. .......... 310/364

FOREIGN PATENT DOCUMENTS

JP  10-270979  10/1998

* cited by examiner

Primary Examiner—Dinh T. Le
(74) Attorney, Agent, or Firm—Keating & Bennett, LLP

(57) ABSTRACT

A composite-material vibrating device includes a vibrating member, at least three reflective layers, and holding members. The vibrating member is made of material having a first acoustic impedance $Z_1$ and that functions as a vibration generating source. The at least three reflective layers are made of material having a second acoustic impedance $Z_2$ that is smaller than the first acoustic impedance $Z_1$, and are coupled to respective outer surfaces located along three directions of the vibrating member. The holding members are made of a material having a third acoustic impedance $Z_3$ that is greater than the second acoustic impedance $Z_2$ and that are coupled to surfaces opposite to the surfaces, coupled to the vibrating member, of the reflective layers. Vibrations that have propagated from the vibrating member to the reflective layers are reflected at interfaces between the reflective layers and the corresponding holding members.

20 Claims, 24 Drawing Sheets

COMPOSITE-MATERIAL VIBRATING DEVICE

BACKGROUND OF THE INVENTION

1. Field of the Invention

The present invention relates to composite-material vibrating devices in which a plurality of material portions having different acoustic impedances are coupled, and more particularly relates to a composite-material vibrating device in which a plurality of material layers having different acoustic impedances are coupled to a vibrating member such as a piezoelectric element.

The present invention further relates to methods for fabricating a composite-material vibrating device in which a plurality of material portions having different acoustic impedances are coupled, and more particularly relates to a method for fabricating a composite-material vibrating device that is capable of reflecting vibrations that have propagated from a vibrating member at the interfaces between the other material portions to thereby confine the vibrations in a portion within the interfaces.

2. Description of the Related Art

Conventionally, a structure in which casing substrates are laminated on the upper and lower surfaces of a piezoelectric vibrating element has been widely used for piezoelectric resonator components for use as piezoelectric resonators or piezoelectric filters. In this case, a space for permitting vibration of the piezoelectric vibrating portion of the piezoelectric element must be formed in the laminate. Thus, examples of methods that have been available include a method in which a depression for forming a cavity is provided in a piezoelectric-element-side surface of a casing substrate to be laminated and a method in which a region corresponding to a cavity is provided in an adhesive-applied area for forming the cavity before a casing substrate is laminated on a piezoelectric element.

As described above, in the laminated piezoelectric resonator components of the related art, a cavity for permitting vibrations of the piezoelectric vibrating portion must be formed. This makes it difficult to achieve miniaturization and cost reduction.

Meanwhile, Japanese Unexamined Patent Application Publication No. 10-270979 discloses a bulk acoustic wave filter having a laminated structure without a cavity. As shown in FIG. 13, in a bulk acoustic wave filter 211, a piezoelectric filter is configured by providing a large number of films on a substrate 212.

That is, in this laminated structure, a piezoelectric layer 213 is formed and electrodes 214 and 215 are provided on the upper and lower surfaces of the piezoelectric layer 213 to provide a piezoelectric resonator.

Layers made of silicon, polysilicon, or other suitable material are provided on the lower surface of the piezoelectric resonator to provide an acoustic mirror 219 having a laminated structure that includes a top layer 216, a middle layer 217, and a bottom layer 218. Also, an acoustic mirror 220 having a similar laminated structure is provided on the upper surface of the piezoelectric resonator and a passivation layer 221 is formed on the acoustic mirror 220 as a protection layer.

In the acoustic mirror 219, the acoustic impedance of the middle layer 217 is higher than the acoustic impedance of the top layer 216 and the bottom layer 218. In the acoustic mirror 220, similarly, the acoustic impedance of the middle layer higher than the acoustic impedance of the top and bottom layers.

In the bulk acoustic wave filter 211, the provision of the acoustic mirrors 219 and 220 on the piezoelectric resonator portion allows vibrations that have propagated from the piezoelectric resonator to be reflected back toward the piezoelectric resonator. Thus, this structure can be mechanically supported using the substrate 212 without affecting the resonance characteristics of the piezoelectric resonator portion.

The bulk acoustic wave filter 211 shown in FIG. 13 is configured such that the acoustic mirrors 219 and 220 reflect vibrations that have propagated from the piezoelectric resonator. In each of the acoustic mirrors 219 and 220, the top and bottom layers are provided on the corresponding upper and lower surfaces of the middle layer and the acoustic impedance of the middle layer is higher than the acoustic impedance of the top and bottom layers. Thus, a large number of material layers must be provided for the acoustic mirrors 219 and 220. Thus, while no cavity needs to be formed, a large number of material layers must be provided in the bulk acoustic wave filters 211, which makes it difficult to achieve a compact, particularly, low profile structure. The fabrication process is also complicated.

In addition, in the bulk acoustic wave filter 211, lateral vibrations in the piezoelectric resonator propagate and the vibrations that have alternately propagated are damped at side portions of the piezoelectric resonator. Thus, the side portions of the piezoelectric resonator portion are fixed, which poses a problem in that resonance characteristics of the piezoelectric resonator are deteriorated by the holding structures.

SUMMARY OF THE INVENTION

To overcome the shortcomings and problems of the related art described above, preferred embodiments of the present invention provide a composite-material vibrating device that is inexpensive, compact, and particularly suitable for a low profile application and that can be supported with little or no influence on vibration characteristics of a vibrating member using a relatively simple structure.

A composite-material vibrating device according to a preferred embodiment of the present invention includes a vibrating member that is made of material having a first acoustic impedance $Z_1$ and that defines a vibration generating source, and at least three reflective layers that are coupled to corresponding outer surfaces located in at least three directions of the vibrating member and that are made of material having a second acoustic impedance $Z_2$ that is smaller than the first acoustic impedance $Z_1$. The composite-material vibrating device further includes holding members that are made of material that are coupled to surfaces opposite to the surfaces, coupled to the vibrating member, of the reflective layers and that are made of a material having a third acoustic impedance $Z_3$ that is greater than the second acoustic impedance $Z_2$. Vibrations that have propagated from the vibrating member to the reflective layers are reflected at interfaces between the reflective layers and the corresponding holding members.

In preferred embodiments of the present invention, vibrations that have propagated from the vibrating member to the reflective layers are reflected at the interfaces between the reflective layers and the corresponding holding members. With this arrangement, vibrations of the vibrating member are securely confined in regions within the interfaces. Thus, the composite-material vibrating device of preferred embodiments of the present invention can be supported by the holding members without preventing the vibration of the vibrating member using a relatively simple structure. Thus, there is no need to form a cavity for permitting vibration of the vibrating member, which allows for significant reduction in the size and cost of the composite-material vibrating device. In addition, since the acoustic impedance $Z_2$ is preferably smaller than the acoustic impedances $Z_1$ and $Z_3$ to thereby reflect vibrations at the interfaces, the vibration mode of the vibrating member used is not particularly limited. Thus, it is possible to easily provide composite-material vibrating devices utilizing various vibration modes. Preferably, the vibrating member has a substantially rectangular parallelepiped or substantially cubic shape and the reflective layers are provided on at least three outer surfaces of the vibrating member. Thus, the composite-material vibrating device can be supported using an outer surface, which is located in any one of the at least three directions, of the composite-material vibrating device.

Preferably, the ratio $Z_2/Z_1$ of the second acoustic impedance $Z_2$ to the first acoustic impedance $Z_1$ is about 0.2 or less. This can further ensure that vibrations that have propagated from the vibrating member to the reflective layers are reflected.

Preferably, the ratio $Z_2/Z_3$ of the second acoustic impedance $Z_2$ to the third acoustic impedance $Z_3$ is about 0.2 or less. This can further ensure that vibrations that have propagated from the vibrating member to the reflective layers are reflected at the interfaces between the reflective layers and the corresponding holding members.

Preferably, propagating vibrations that propagate in the reflective layers from the vibrating member toward the holding members are reflected at the interfaces between the reflective layers and the corresponding holding members, and the amplitude direction of the propagating vibrations is substantially perpendicular to the propagating direction of the propagating vibrations. This arrangement allows the thickness of the reflective layers to be reduced compared to a case in which the amplitude direction of the propagating vibrations is parallel to the propagating direction.

In preferred embodiments of the present invention, while the vibrating member is not particularly limited, the vibrating member preferably is made of an electromechanical coupling conversion element. Further, the electromechanical coupling conversion element is preferably a piezoelectric element or an electrostriction element.

The reflective layers may each include a plurality of material layers having different acoustic impedances. In this case, selecting the acoustic impedances of the plurality of material layers can facilitate the adjustment of the acoustic impedance of the reflective layers.

The distance from the interfaces between the reflective layers and the vibrating member to the interfaces between the reflective layers and the corresponding holding members is preferably in the range of $n \cdot \lambda/4 \pm \lambda/8$ (n is an odd number), where $\lambda$ is the wavelength of propagating vibrations that propagate in the reflective layers toward the holding members in response to vibrations from the vibrating member. This allows the propagating vibrations to be more effectively reflected at the aforementioned interfaces and allows a further reduction in influence on the vibrating member which results from the support arrangement.

Preferably, the holding members have a plurality of capacitance electrodes for constituting a capacitor. Thus, the holding members are utilized to constitute the capacitor. Consequently, the combination of the vibrating member and the capacitor allows the provision of a miniaturized vibrator or other suitable component.

Another preferred embodiment of the present invention provides a method for fabricating a composite-material vibrating device in which a plurality of material portions having different acoustic impedances are coupled. In this case, a composite-material vibrating device according to preferred embodiments of the present invention has a structure in which holding substrates are coupled to a plate vibrating member with reflective layers interposed therebetween. The acoustic impedance $Z_2$ of the reflective layers is preferably smaller than the acoustic impedances $Z_1$ of the vibrating member and the acoustic impedance $Z_3$ of the holding substrates. As a result, vibrations that have propagated from the vibrating member are reflected at the interfaces between the reflective layers and the corresponding holding substrates. This makes it possible to achieve mechanical support using the holding substrates without affecting the vibration characteristics of the vibrating member.

Another preferred embodiment of the present invention provides a method for fabricating a composite-material vibrating device in which a plurality of material portions having different acoustic impedances are coupled. The fabrication method includes a step of preparing a plate vibrating member having a first acoustic impedance $Z_1$ and a holding substrate having a third acoustic impedance $Z_3$ and a step of applying a fluid material to one surface of the vibrating member or holding substrate such that the thickness thereof becomes a thickness for forming a reflective layer having a desired thickness. After being cured, the fluid material becomes the reflective layer having a second acoustic impedance that is smaller than the first and third acoustic impedances. The fabrication method further includes a step of curing the fluid material and, a step of laminating the vibrating member and the holding member with the fluid material interposed therebetween, before or after the fluid material is cured. It is therefore possible to ensure the formation of the reflective layer having a desired thickness.

The step of applying the fluid material may be performed in such a manner that a strip protrusion is formed on the surface, to which the fluid material is to be applied, of the vibrating member or the holding substrate so as to correspond to the thickness of the fluid material to be applied and the fluid material is applied to a region that is surrounded by the strip protrusion. Application of the fluid material to a region that is surrounded by the strip protrusion allows, in accordance with the thickness of the strip protrusion, high-accuracy control of the thickness of the fluid material to be applied. As a result, it is possible to form a reflective layer that is improved in thickness accuracy.

Preferably, the strip protrusion is integrally formed with the vibrating member or the holding substrate using the same material. In this case, there is no need to prepare the strip protrusion as a separate member. Only preparing the vibrating member or the holding member with which the strip protrusion is integrated can facilitate the formation of a reflective layer that is improved in thickness accuracy.

The step of applying the fluid material may be performed in such a manner that a depression having a depth that corresponds to the thickness of the fluid material to be applied is formed in one surface of the holding substrate and the fluid material is applied in the depression. Since the fluid material is applied in the depression, the thickness of the fluid material to be applied can be accurately controlled in accordance with the depth of the depression. As a result, it is possible to form a reflective layer that has improved thickness accuracy.

In the step of applying the fluid material, the fluid material may contain a spherical or columnar substance having a thickness that is substantially the same as the thickness of the reflective layer, and the holding substrate and the vibrating member are laminated with the fluid material before being cured and then the fluid material is cured. In this case, since the vibrating member and the holding member are laminated with the fluid material containing the spherical or columnar substance, the reflective layer having a thickness corresponding to the size of the spherical or columnar substance is reliably formed. As a result, it is possible to provide a reflective layer that is improved in thickness accuracy.

The step of curing the fluid material may be performed before the vibrating member and the holding member, to one of which the fluid material being applied, are laminated together.

The step of curing the fluid material may be performed after the vibrating member and the holding member, to one of which the fluid material being applied, are laminated together. In this manner, the fluid material may be cured either after or before the lamination.

Another preferred embodiment of the present invention provides a method for fabricating a composite-material vibrating device in which a plurality of material portions having different acoustic impedances are coupled. The fabrication method includes a step of preparing a plate vibrating member having a first acoustic impedance $Z_1$ and a holding substrate that is made of material having a third acoustic impedance $Z_3$ and a step of preparing a reflective-layer-constituent plate member having a second acoustic impedance $Z_2$ that is smaller than the first and third acoustic impedances $Z_1$ and $Z_3$. The fabrication method further includes a step of processing the reflective-layer-constituent plate member so as to provide a reflective layer having a desired thickness and a step of laminating the vibrating member and the holding substrate with the reflective layer having the desired thickness. It is therefore possible to secure the provision of a composite-material vibrating device having reflective layers with a desired thickness.

Accordingly, preferred embodiments of the present invention ensure the provision of a composite-material vibrating device having reflective layers that are superior in thickness accuracy.

In preferred embodiments of the present invention, while the vibrating member is not particularly limited as long as it functions as a vibration generating source, it is preferably configured with an electromechanical coupling conversion element. Examples of the electromechanical coupling conversion element include a piezoelectric element and electrostriction element.

Other features, elements, characteristics, steps, and advantages of the present invention will become more apparent from the following detailed description of preferred embodiments thereof with reference to the attached drawings.

DETAILED DESCRIPTION OF PREFERRED EMBODIMENTS

The present invention will become apparent from the following description of specific preferred embodiments thereof with reference to accompanying drawings.

Figure 1:
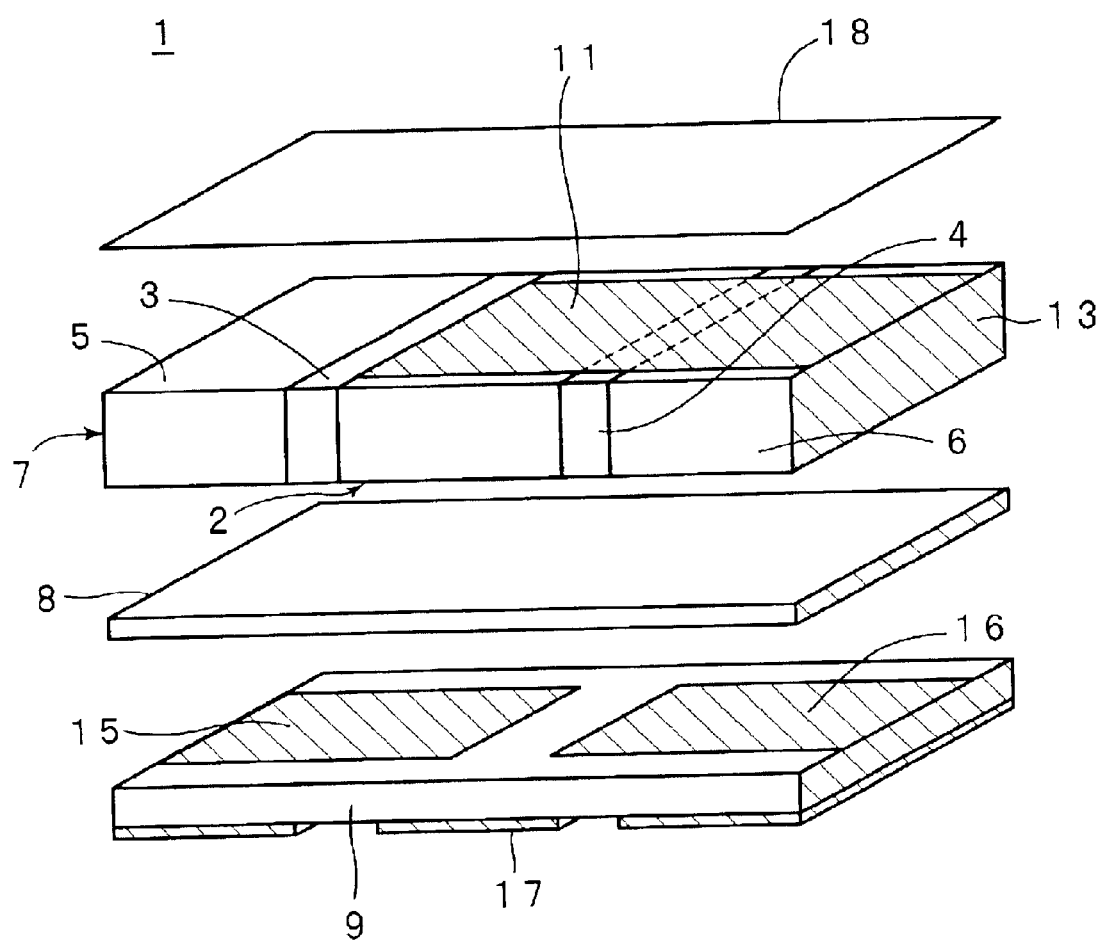
FIG. 1 is an exploded perspective view of a composite-material vibrating device according to a first preferred embodiment of the present invention.
Figure 2:
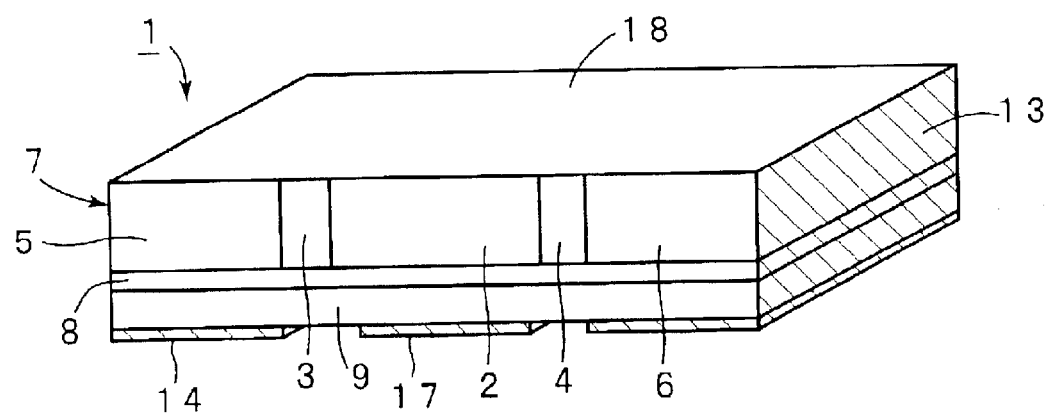
FIG. 2 is a perspective view illustrating the outer appearance of the composite-material vibrating device of the first preferred embodiment of the present invention.
Figure 3:
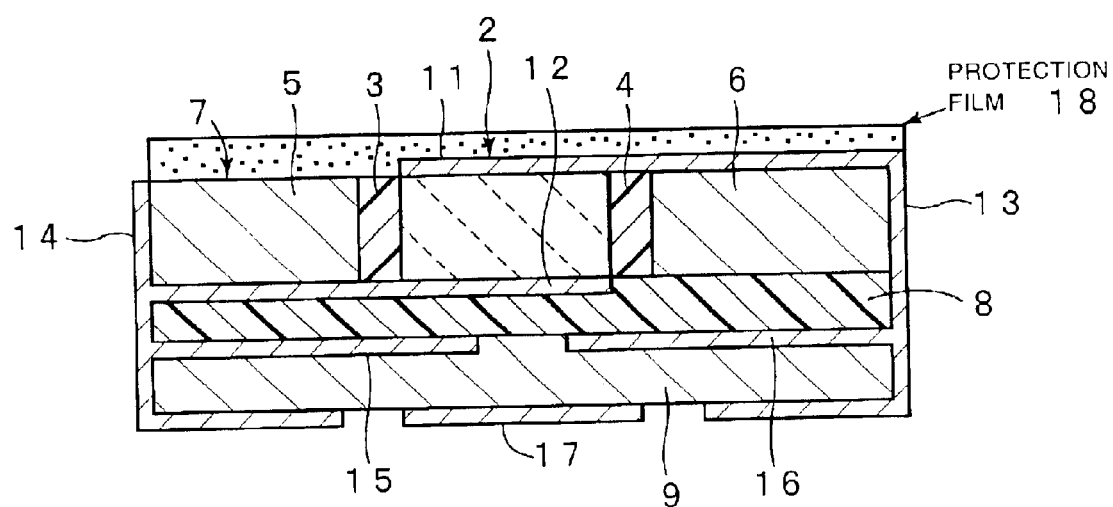
FIG. 3 is a longitudinal sectional view of the composite-material vibrating device of the first preferred embodiment of the present invention.

FIG. 1 is an exploded perspective view of a composite-material vibrating device according to a first preferred embodiment of the present invention, FIG. 2 is a perspective view of the external appearance thereof, and FIG. 3 is a longitudinal sectional view thereof.

As shown in FIG. 1, in a composite-material vibrating device 1 of this preferred embodiment, a piezoelectric resonator 2 is preferably used as a vibrating member. The piezoelectric resonator 2 is configured using a substantially rectangular ceramic plate that is made of, for example, a lead zirconate titanate piezoelectric ceramic. The ceramic plate is polarized in the thickness direction. Excitation electrodes 11 and 12 are provided on the upper and lower surfaces of the ceramic plate. Application of an AC voltage between the excitation electrodes 11 and 12 causes the piezoelectric resonator 2 to be excited in a thickness extensional vibration mode. The acoustic impedance $Z_1$ of the ceramic plate is preferably about $18.8 \times 10^6 \text{N·s·m}^{-3}$.

Additionally, first and second reflective layers 3 and 4 are coupled to corresponding ends of the piezoelectric resonator 2 and first and second holding members 5 and 6 are coupled to corresponding outer ends of the reflective layers 3 and 4. In this preferred embodiment, the piezoelectric resonator 2, the reflective layers 3 and 4, and the holding members 5 and 6 constitute an elongated strip structure 7.

While materials constituting the reflective layers 3 and 4 are not particularly limited, an epoxy resin is used to constitute the reflective layers 3 and 4 in this preferred embodiment. The acoustic impedance $Z_2$ of the reflective layers 3 and 4 is preferably about $1.2 \times 10^6 \text{N·s·m}^{-3}$. Meanwhile, a ceramic is used to constitute the holding members 5 and 6 in this preferred embodiment, and the acoustic impedance $Z_3$ thereof is preferably about $18.8 \times 10^6 \text{N·s·m}^{-3}$.

The excitation electrode 11, which is provided on the upper surface of the piezoelectric resonator 2, is arranged on the upper surface of the structure 7 so as to reach one edge thereof in the longitudinal direction and is electrically connected to an outer electrode 13 that is provided on one end surface of the composite-material vibrating device 1.

Similarly, the excitation electrode 12, which is provided on the lower surface of the structure 7, extends to one edge in the longitudinal direction and is electrically connected to an outer electrode 14, which will be described below.

A third reflective layer 8 is stacked on the lower surface of the structure 7. The reflective layer 8 is preferably made of the same epoxy resin as that of the reflective layers 3 and 4, and thus the acoustic impedance $Z_2$ of the reflective layer 8 is preferably about $1.2 \times 10^6 \text{N·s·m}^{-3}$. The acoustic impedance of the reflective layer 8, however, does not necessarily have to be the same as that of the reflective layers 3 and 4.

A third holding member 9 is stacked on the lower surface of the reflective layer 8. The holding member 9 is preferably made of a ceramic in this preferred embodiment, and the acoustic impedance $Z_3$ thereof is preferably about $18.8 \times 10^6 \text{N·s·m}^{-3}$.

The holding member 9 preferably has a substantially rectangular plate shape, and capacitance electrodes 15 and 16 are provided on the upper surface thereof. A capacitance electrode 17 is provided at the center of the lower surface of the holding member 9 so as to oppose the capacitance electrodes 15 and 16 with the holding member 9 interposed therebetween. The capacitance electrodes 15, 16, and 17 constitute a capacitor in the holding member 9.

A protection film 18, which is made of an insulating resin, is stacked on the upper surface of the structure 7 described above. The protection film is arranged so as to coat the excitation electrode 11 and to thereby improve the moisture resistance and other characteristics. The insulating resin that constitutes the protection film 18 is not particularly limited. However, a material having superior flexibility, such as a silicone resin, is desirably used in order to permit the piezoelectric resonator 2 to vibrate.

As shown in FIG. 3, the outer electrodes 13 and 14 are provided on corresponding side surfaces of the composite-material vibrating device 1. The outer electrodes 13 and 14 are arranged so as to reach not only the side surfaces of the composite-material vibrating device 1 but also the lower surface thereof. Thus, the composite-material vibrating device 1 can be readily mounted, using the lower surface, on a surface of a printed circuit board or other suitable substrate. In this case, the outer electrodes 13 and 14 and the capacitance electrode 17 are connected to the outside and thus, the composite-material vibrating device 1 can operate as a three-terminal built-in-capacitance piezoelectric vibrator.

In the composite-material vibrating device 1 of this preferred embodiment, the first and second reflective layers 3 and 4 are coupled to the pair of side surfaces of the piezoelectric resonator 2 that defines a vibrating member, and the third reflective layer 8 is coupled to the lower surface of the composite-material vibrating device 1. The holding members 5, 6, and 9 are coupled to the respective surfaces that are opposite to the surfaces, connected to the piezoelectric resonator 2, of the reflective layers 3, 4, and 8. In other words, a cavity for permitting vibration of the piezoelectric resonator 2 is not provided. Thus, since there is no need to provide a cavity, the composite-material vibrating device 1 can achieve miniaturization and cost reduction.

The reason why a cavity can be eliminated is that the acoustic impedance $Z_2$ Of the reflective layers 3, 4, and 8 is smaller than the acoustic impedances $Z_1$ and $Z_3$ of materials constituting the piezoelectric resonator 2 and the holding members 5, 6, and 9. This will be described specifically in conjunction with an experimental example.

The composite-material vibrating device 1 was fabricated under the following conditions. The piezoelectric resonator 2 was constructed using the aforementioned lead-zirconate-titanate piezoelectric ceramic plate and the structure 7 had a longitudinal dimension of about 0.65 mm, a width-direction dimension of about 0.5 mm, and a thickness of about 0.15 mm. The piezoelectric resonator 2 alone had a resonant frequency of approximately 8 MHz. The thickness of the reflective layers 3 and 4 was about 0.040 mm. That is, the distance from the interface between the piezoelectric resonator 2 and the reflective layer 3 to the interface between the reflective layer 3 and the holding member 5 was about 0.040 mm, and the distance from the interface between the piezoelectric resonator 2 and the reflective layer 4 to the interface between the reflective layer 4 and the holding member 6 was about 0.040 mm. The holding member 5 and 6 had a dimension of about 0.635 mm in the longitudinal direction of the structure 7. Thus, the structure 7 had a length of about 2.0 mm, a width of about 0.5 mm, and a thickness of about 0.15 mm.

The thickness of the reflective layers 8, i.e., the distance from the interface between the piezoelectric resonator 2 and the reflective layer 8 to the interface between the reflective layer 8 and the holding member 9, was about 0.040 mm. The holding member 9 had a thickness of about 0.1 mm. The reflective layer 8 and the holding member 9 had the same shape as the structure 7 in plan view. The protection film 18 was provided by depositing a silicone resin to have a thickness of about 20 $\mu$m.

Measurement of the resonant frequency of the composite-material vibrating device 1 provided as described above showed that the rate of decrease in band width ratio was about 5%, which was almost the same as that of the piezoelectric resonator 2 alone.

As described above, even when a cavity for permitting vibration of the piezoelectric resonator 2 is not provided, this preferred embodiment can achieve resonance characteristics comparable to those of the piezoelectric resonator 2 alone. This is because vibrations that have propagated from the piezoelectric resonator 2 to the reflective layers 3, 4, and 8 are reflected at the interfaces between the reflective layers 3, 4, and 8 and the corresponding holding members 5, 6, and 9.

Thus, this preferred embodiment can reduce the entire size and cost of the composite-material vibrating device 1. In particular, this preferred embodiment can effectively facilitate miniaturization of the composite-material vibrating device 1 without impairing resonance characteristics of the piezoelectric resonator 2, since the reflective layers 3, 4, and 8 are provided on the outer ends located in corresponding three directions of the piezoelectric resonator 2, i.e., the pair of side surfaces and the lower surface thereof.

The present inventor considered the experimental results obtained from the composite-material vibrating device 1 and repeated the experiment while variously changing materials, dimensions, and other characteristics of the piezoelectric resonator 2, the reflective layers 3, 4, and 8, and the holding members 5, 6, and 9 in the composite-material vibrating device 1. As a result, the present inventor discovered that setting the acoustic impedance $Z_2$ of the reflective layers 3, 4, and 8 smaller than the acoustic impedance $Z_1$ of the piezoelectric resonator 2 and the acoustic impedance $Z_3$ of the holding members 5, 6, and 9 can substantially prevent propagation of vibration from the piezoelectric resonator 2 to the holding members 5, 6, and 9, in the same manner as the experimental example described above.

This will now be described with reference to FIGS. 4 and 5.

First, composite-material vibrating devices having various different acoustic impedances ratios $Z_2/Z_1$ were fabricated in such a manner that materials constituting the reflective layers were variously changed in the composite-material vibrating device 1 of the preferred embodiment described above with the other configurations being the same as those in the preferred embodiment. The resonant frequencies of these composite-material vibrating devices were measured and the rates of resonant frequency change when the acoustic impedance ratios $Z_2/Z_1$ were varied were determined. The results are shown in FIG. 4.

The rate of resonant frequency change is a value expressed by $[(F-F_0)/F_0] \times 100$ (%), where $F_0$ is the resonant frequency of the piezoelectric resonator 2 alone and F is the resonant frequency of each composite-material vibrating device fabricated as described above.

Figure 4:
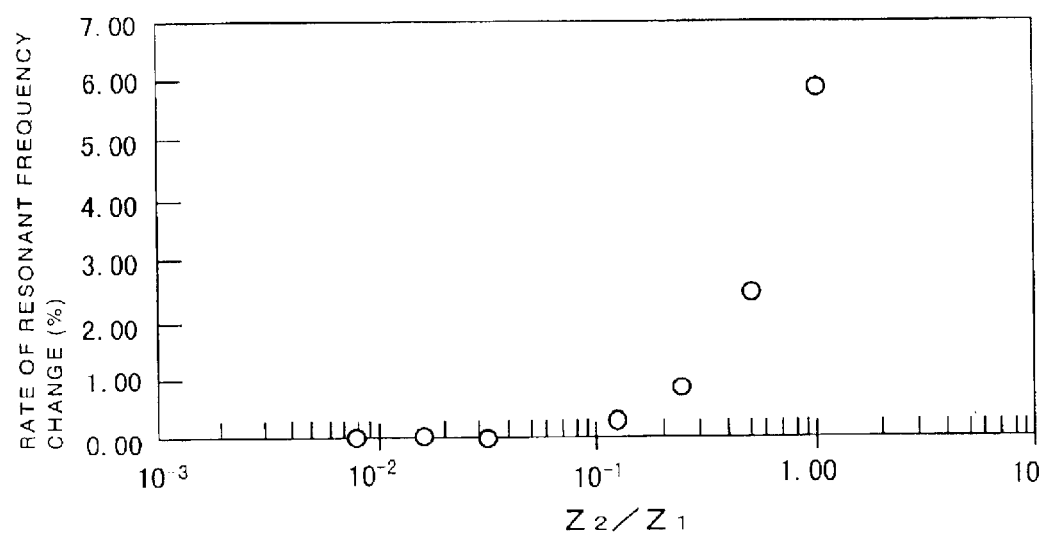
FIG. 4 is a graph showing the rate of resonant frequency change of the composite-material vibrating device of the first preferred embodiment when an acoustic impedance ratio $Z_2/Z_1$ is changed.

As is clear from FIG. 4, for an acoustic impedance ratio $Z_2/Z_1$ of less than 1, the rate of resonant frequency change is small. Preferably, for an acoustic impedance ratio $Z_2/Z_1$ of about 0.2 or less, the ratio of resonant frequency change is very small, i.e., about 0.4% or less, and more preferably, for an acoustic impedance of $Z_2/Z_1$ of about 0.1 or less, the ratio of resonant frequency change is even smaller, i.e., about 0.1% or less.

Next, various composite-material vibrating devices having different acoustic impedances ratios $Z_2/Z_3$ were fabricated in such a manner that materials constituting the holding members were variously changed while the reflective layers were configured as in the preferred embodiment described above in the composite-material vibrating device of the preferred embodiment. Then, the rates of resonant frequency change were determined in the same manner described above. The result is shown in FIG. 5.

Figure 5:
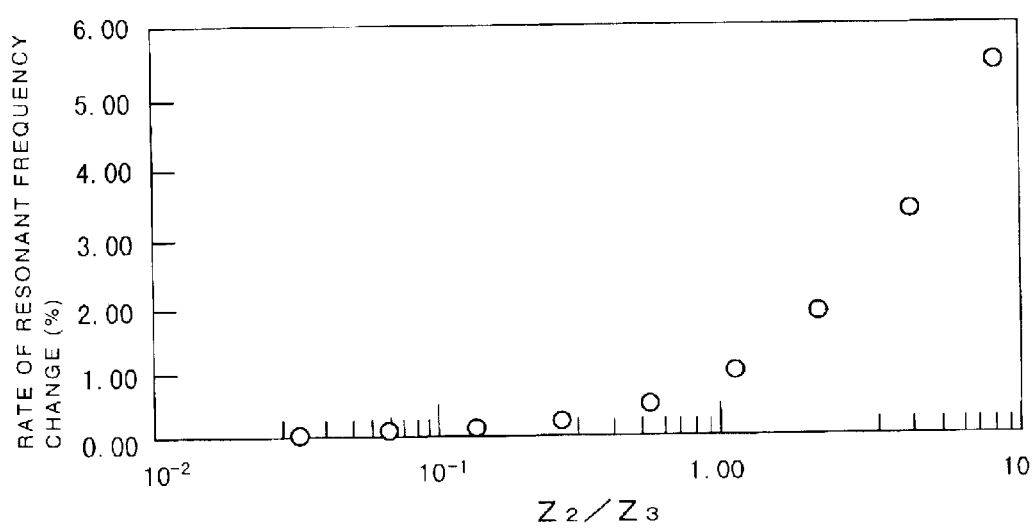
FIG. 5 is a graph showing the rate of resonant frequency change of the composite-material vibrating device of the first preferred embodiment when an acoustic impedance ratio $Z_2/Z_3$ is changed.

As is clear from FIG. 5, for an acoustic impedance ratio $Z_2/Z_3$ of less than about 1, the rate of resonant frequency change is small. Preferably, for an acoustic impedance ratio $Z_2/Z_3$ of about 0.2 or less, the rate of resonant frequency change is about 0.215% or less, and more preferably, for an acoustic impedance ratio $Z_2/Z_3$ of about 0.1 or less, the rate of resonant frequency change is about 0.1% or less.

Thus, as is clear from FIGS. 4 and 5, the acoustic impedance ratios $Z_2/Z_1$ and $Z_2/Z_3$ are preferably about 0.2 or less and more preferably about 0.1 or less.

The acoustic impedance $Z_2$ of the reflective layers 3, 4, and 8 and the acoustic impedance $Z_3$ of the holding members 5, 6, and 9 can be easily controlled by changing materials constituting these layers and members or the compositions of the materials. For example, while an epoxy resin is used for the reflective layers 3, 4, and 8 in the preferred embodiment described above, an organic or inorganic powder or other suitable material having an acoustic impedance that is different from that of the epoxy resin can be mixed in the epoxy resin to adjust the acoustic impedances $Z_2$ of the reflective layers 3, 4, and 8.

In addition, with regard to the holding members 5, 6, and 9, an organic or inorganic powder or other suitable material having an acoustic impedance that is different from that of the ceramic that constitutes the holding members 5, 6, and 9 can be mixed in the ceramic to facilitate adjustment of the acoustic impedance $Z_3$ thereof.

The materials that constitute the reflective layers 3, 4, and 8 and the holding members 5, 6, and 9 are not limited to an epoxy resin and ceramic. Various organic or inorganic materials can be used to provide desired acoustic impedances $Z_2$ and $Z_3$.

Next, the present inventor examined changes in the bandwidth and resonant frequency when the thicknesses of the reflective layers 3 and 4 were variously changed in the composite-material vibrating device 1 of the preferred embodiment described above. The results are shown in FIGS. 6 and 7.

Figure 6:
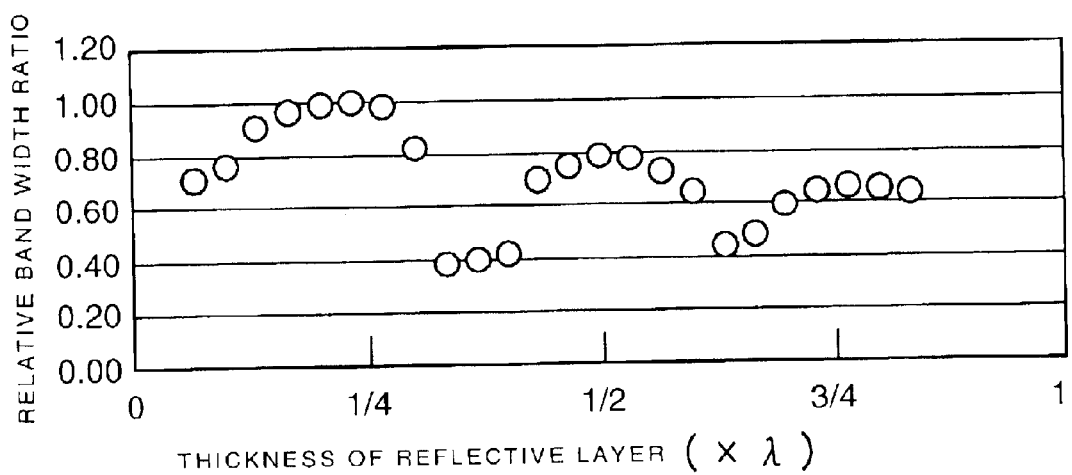
FIG. 6 is a graph showing a change in the relative band width ratio of the composite-material vibrating device when the thickness of reflective layers is changed.
Figure 7:
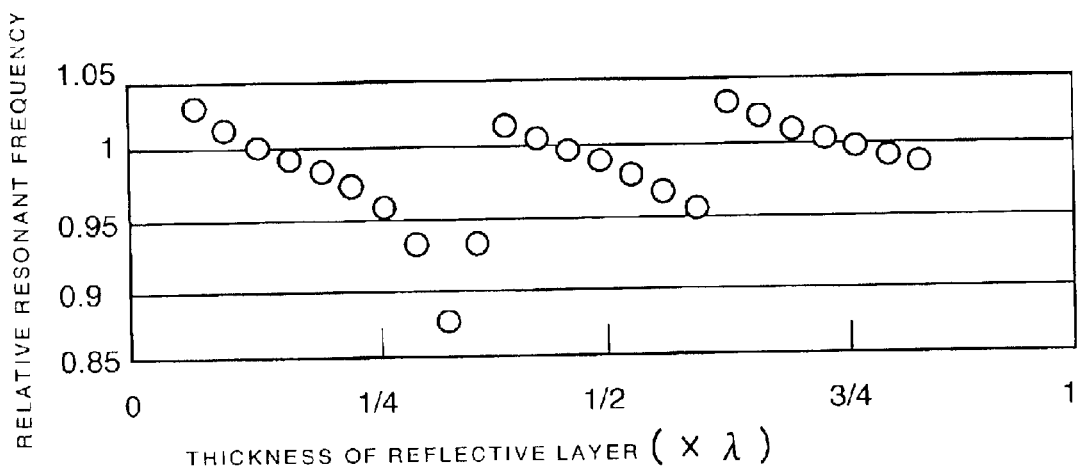
FIG. 7 is a graph showing a change in the relative resonant frequency of the composite-material vibrating device when the thickness of reflective layers is changes.

FIG. 6 shows a change in relative band width ratio when the thickness of the reflective layers 3 and 4 is variously changed in the above-described preferred embodiment and FIG. 7 shows a change in relative resonant frequency. The relative band width ratio herein means the ratio of the band width ratio of the fabricated composite-material vibrating device to the band width ratio of the piezoelectric resonator 2 alone without the reflective layers 3, 4, and 8 and the holding members 5, 6, and 9. The relative resonant frequency means the ratio of the resonant frequency of the prepared composite-material vibrating device to the resonant frequency of the piezoelectric resonator 2 alone.

The thickness, which is indicated by the horizontal axes in FIGS. 6 and 7, of the reflective layers 3 and 4, is a value based on the wavelength λ of a surface acoustic wave that is excited by the piezoelectric resonator 2.

As is clear from FIGS. 6 and 7, a change in the thickness of the reflective layers 3 and 4 causes the relative band width ratio and the relative resonant frequency to vary at a constant cycle. That is, it can be seen that when the thickness of the reflective layers is preferably in the range of about n·λ/4±λ/8 (n is an odd number), the relative band width ratio and the relative resonant frequency are almost the same as the characteristics of the piezoelectric resonator 2 alone. Thus, the thickness of the reflective layers, i.e., the distance of the reflective layers in the traveling directions of vibrations that propagate from the piezoelectric resonator 2 to the reflective layers, is desirably in the range of about n·λ/4±λ/8, where λ is the wavelength of a surface acoustic wave excited by the piezoelectric resonator 2.

Figure 8:
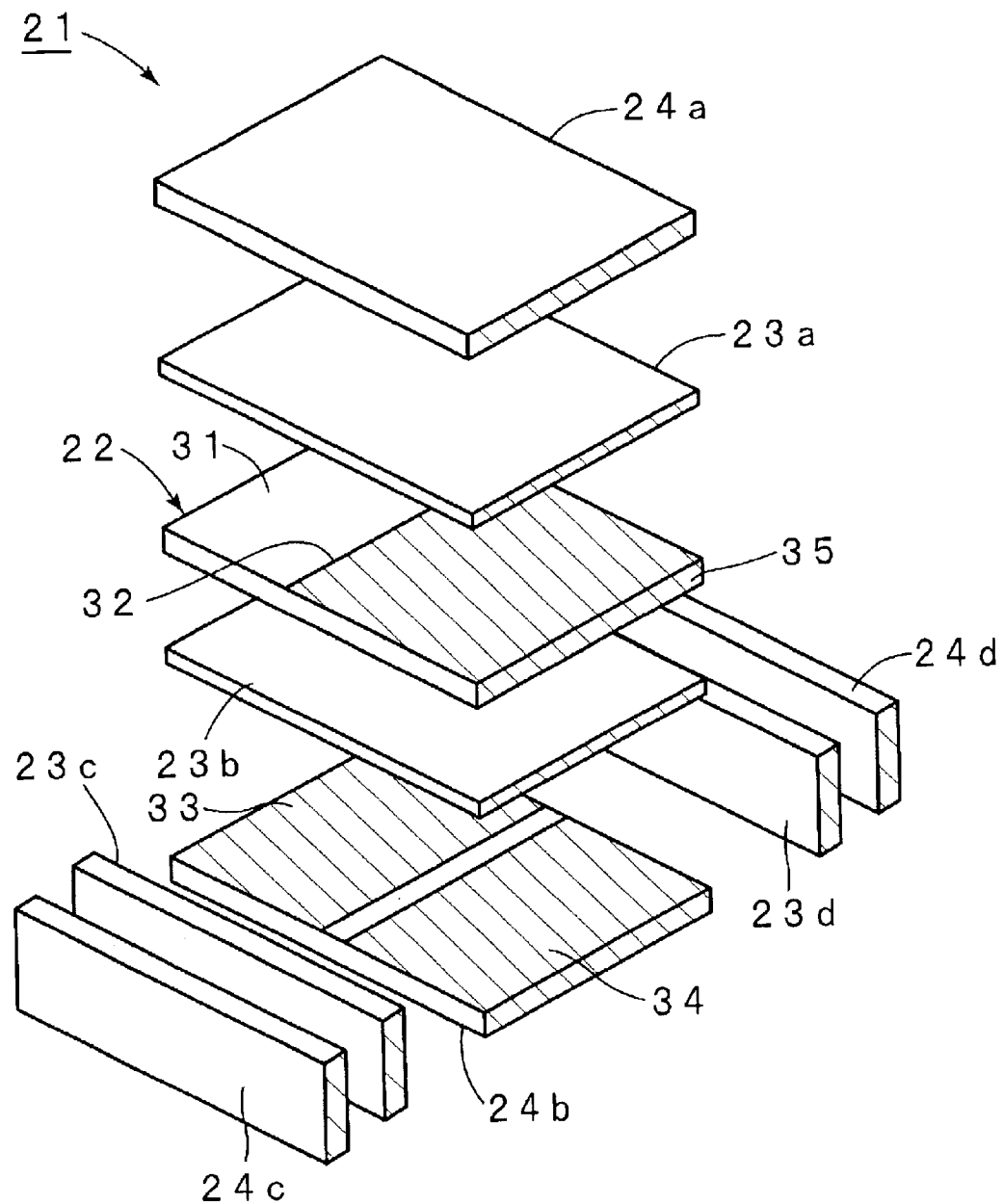
FIG. 8 is an exploded perspective view of a composite-material vibrating device according to a second preferred embodiment of the present invention.
Figure 9:
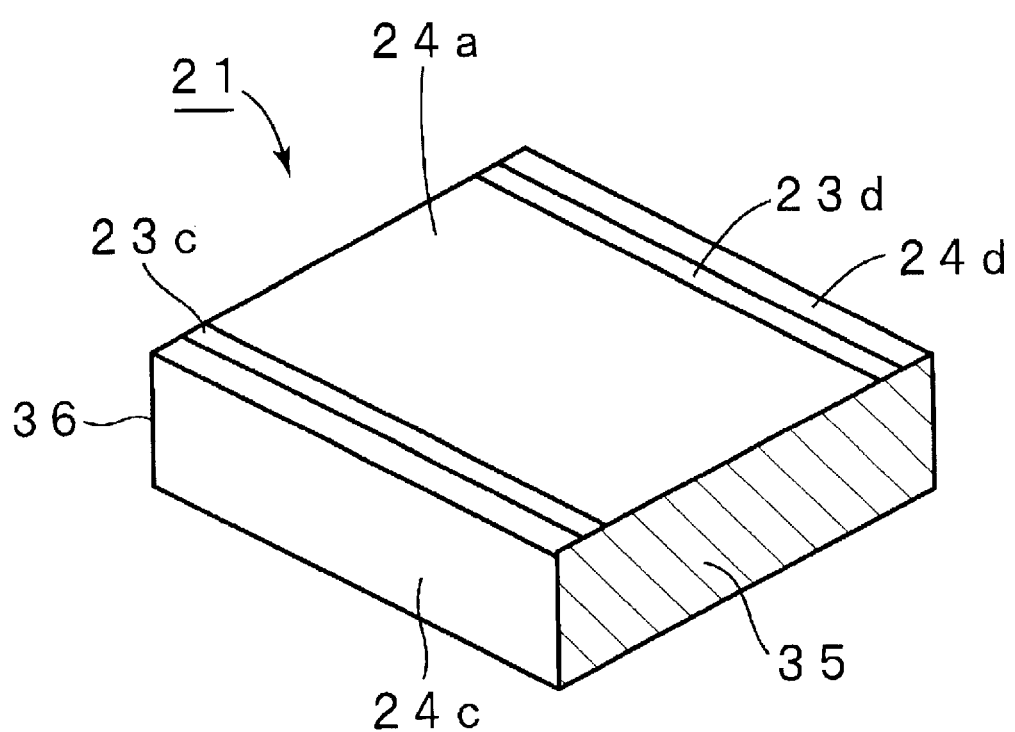
FIG. 9 is a perspective view illustrating the outer appearance of the composite-material vibrating device of the second preferred embodiment of the present invention.

FIG. 8 is an exploded perspective view of a composite-material vibrating device according to a second preferred embodiment of the present invention and FIG. 9 is a perspective view of the external appearance thereof.

As in the first preferred embodiment, a composite-material vibrating device 21 of this preferred embodiment is used as a three-terminal built-in-capacitance piezoelectric resonator. In this case, however, a substantially rectangular piezoelectric resonator 22 that utilizes a thickness shear mode is preferably used as a vibrating member. In the piezoelectric resonator 22, an excitation electrode 32 is provided on the upper surface of a substantially rectangular piezoelectric substrate 31, which is preferably made of a piezoelectric ceramic such as a lead zirconate titanate ceramic. Another excitation electrode, which is not shown in FIG. 8, is provided on the lower surface of the piezoelectric substrate 31. The excitation electrode 32 and the excitation electrode that is provided on the lower surface oppose each other at the center in the longitudinal direction of the piezoelectric substrate 22 with the piezoelectric substrate 31 interposed therebetween.

The excitation electrode 32 is arranged to reach one end surface of the composite-material vibrating device 21. The excitation electrode that is provided on the lower surface is lead out at the opposite end surface of the composite-material vibrating device. The piezoelectric substrate 31 is polarized in a direction that is substantially perpendicular to the two end surfaces of the composite-material vibrating device.

In this preferred embodiment, first and second reflective layers 23a and 23b are stacked on the upper surface and the lower surface of the piezoelectric resonator 22, respectively. Holding members 24a and 24b are stacked on the upper surface of the reflective layer 23a and the lower surface of the reflective layer 23b, respectively.

Further, third and fourth reflective layers 23c and 23d and holding members 24c and 24d are stacked on a pair of side surfaces of the stack that is constituted by the piezoelectric resonator 22, the reflective layers 23a and 23b, and the holding members 24a and 24b. With regard to the holding member 24b, as in the first preferred embodiment, a pair of capacitance electrodes 33 and 34 is provided on the upper surface thereof and a capacitance electrode (not shown) is provided at the center of the lower surface so as to oppose the capacitance electrodes 33 and 34.

As shown in FIG. 9, outer electrodes 35 and 36 are provided on respective opposing end surfaces of the composite-material vibrating device 21. The capacitance electrodes 33 and 34 are electrically connected to the outer electrodes 36 and 35, respectively. Thus, electrically connecting the outer electrodes 35 and 36 and the capacitance electrode that is provided on the lower surface of the holding member 24b to the outside allows the composite-material vibrating device 21 to operate as a three-terminal built-in-capacitance piezoelectric resonator, as in the first preferred embodiment.

In the present preferred embodiment, similarly, the acoustic impedance $Z_2$ of the reflective layers 23a, 23b, 23c, and 23d is preferably smaller than the acoustic impedance $Z_1$ of the piezoelectric resonator 22 and the acoustic impedance $Z_3$ of the holding members 24a to 24d. As a result, as in the composite-material vibrating device 1 of the first preferred embodiment, vibrations that have propagated from the piezoelectric resonator 22 are effectively confined in regions within the interfaces between the reflective layers and the corresponding holding members. Thus, with the composite-material vibrating device 21, even when it is mechanically supported by the holding members 24a, 24b, 24c, and 24d, the resonance characteristics thereof are prevented from deteriorating.

In this manner, in the composite-material vibrating device of preferred embodiments of the present invention, the reflective layers and the holding members may be coupled to outer surfaces located in four directions of the vibrating member, i.e., an upper surface, a lower surface, and a pair of side surfaces of the vibrating member.

Figure 10:
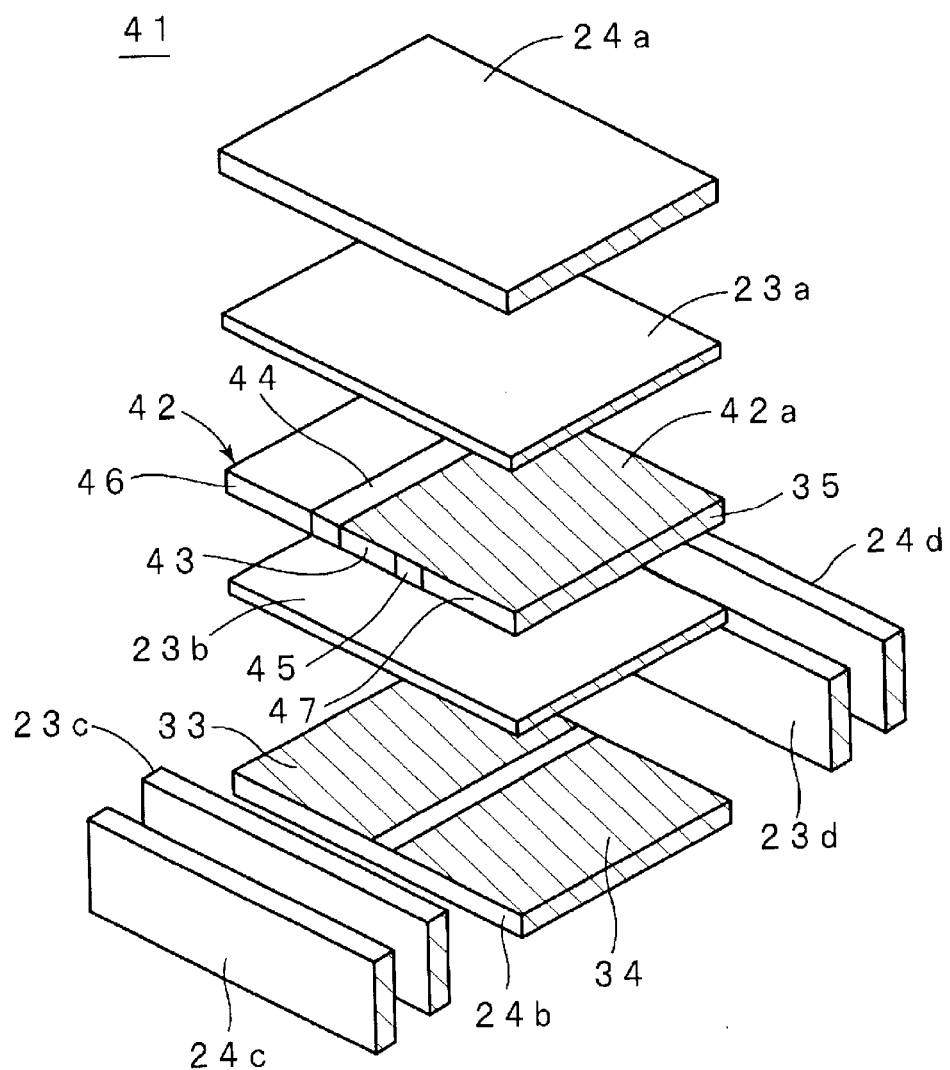
FIG. 10 is an exploded perspective view of a composite-material vibrating device according to a modification of the second preferred embodiment of the present invention.
Figure 11:
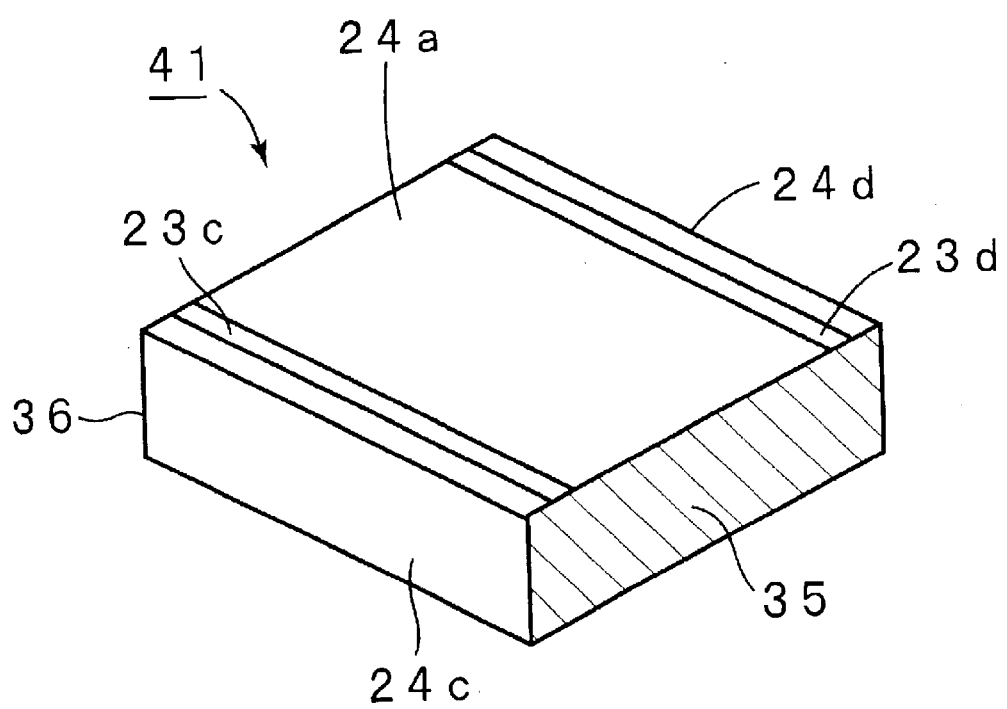
FIG. 11 is a perspective view illustrating the outer appearance of the composite-material vibrating device of the modification of the second preferred embodiment of the present invention.

FIG. 10 is an exploded perspective view illustrating a modification of the composite-material vibrating device of the second preferred embodiment and FIG. 11 is a perspective view of the external appearance thereof.

A composite-material vibrating device 41 of this modification is similar to that of the second preferred embodiment, except that the piezoelectric resonator 22, which is shown in FIG. 8, is replaced with a structure 42 having a substantially rectangular plate shape. Thus, the same portions as those in the second preferred embodiment are denoted with the same reference numerals and the descriptions thereof will be omitted.

The structure 42 has a construction in which a piezoelectric resonator 43, reflective layers 44 and 45, and holding members 46 and 47 are coupled in the longitudinal direction of the structure 42. That is, the structure 42 has a construction similar to the structure 7 of the first preferred embodiment. The piezoelectric resonator 43 is preferably made of a piezoelectric ceramic that is polarized in the thickness direction and has an excitation electrode 42a provided on the upper surface. Another excitation electrode is provided on the lower surface of the piezoelectric resonator 42. Thus, application of an AC voltage between the excitation electrode 42a and the excitation electrode provided on the lower surface allows the piezoelectric resonator 42 to operate as a piezoelectric resonator that utilizes a thickness extensional vibration mode.

In this modification, the reflective layers 44 and 45 and the holding members 46 and 47 are coupled to not only the upper and lower surfaces and a pair of side surfaces of the piezoelectric resonator 43, which defines a vibrating member, but also the remaining pair of side surfaces thereof. Thus, vibrations of the piezoelectric resonator 43 which travel toward all of the directions of the upper, lower, and four side surfaces of the piezoelectric resonator 43 are reflected at the interfaces between the reflective layers 23a to 23d, 44, and 45 and the corresponding holding members 24a to 24d, 46, and 47. This ensures that vibration energy is confined in the region surrounded by the interfaces.

In this modification, since the composite-material vibrating device 41 preferably has a substantially rectangular parallelepiped shape and has the holding members at all the outer surfaces, any outer surface of the composite-material vibrating device 41 can be utilized for mechanical support. As a result, when the composite-material vibrating device 41 is mounted on a circuit board or other suitable substrate, it is possible to substantially enhance the design freedom.

Figure 12:
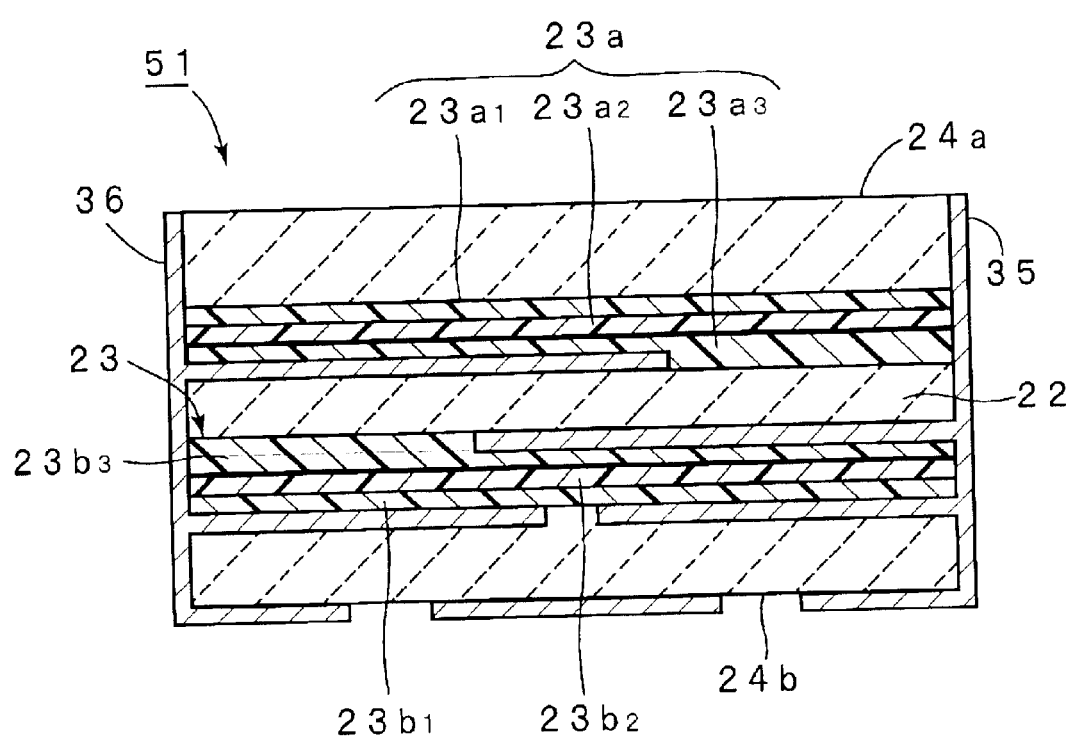
FIG. 12 is a sectional view illustrating a modification of the reflective layers.
Figure 13:
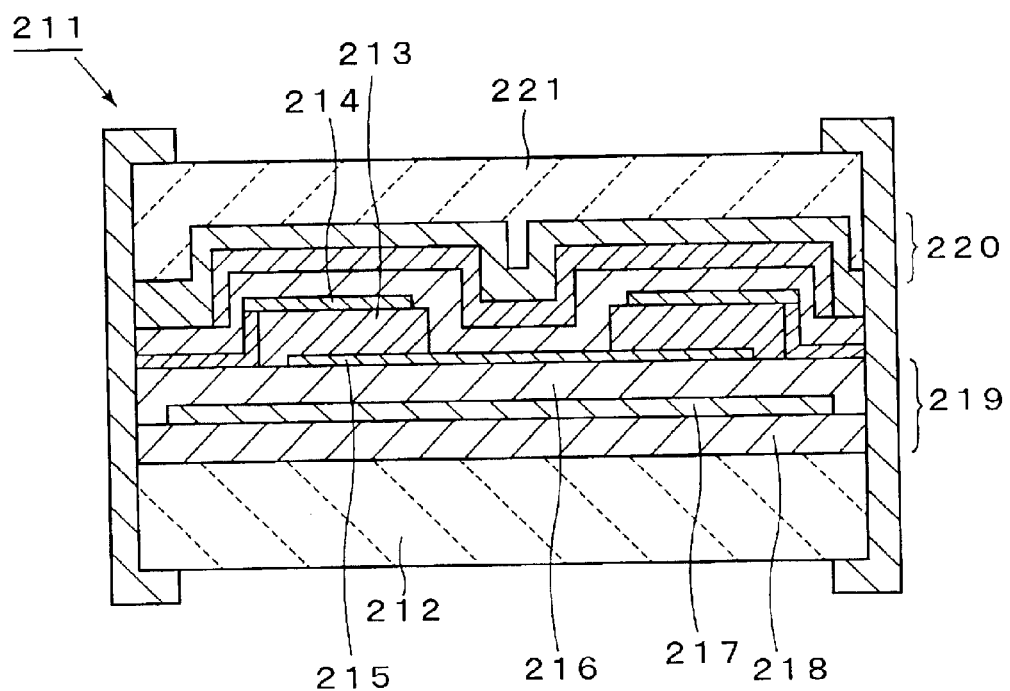
FIG. 13 is a sectional view illustrating a bulk acoustic wave filter of the related art.

FIG. 12 is a front sectional view illustrating a modification of the reflective layers. A composite-material vibrating device 51 shown in FIG. 12 has the same configuration as the composite-material vibrating device 21 of the second preferred embodiment, except for the reflective layers. That is, the cross section shown in FIG. 12 corresponds to a surface that appears when the portion in which the piezoelectric resonator 22, the reflective layers 23a and 23b, and the holding members 24a and 24b are stacked in the second preferred embodiment is cut along the longitudinal direction.

While the reflective layers 23a and 23b each have been constituted by a single material layer in the second preferred embodiment, the reflective layers 23a and 23b may be constituted by a plurality of material layers $23a_1$ to $23a_3$ and a plurality of material layers $23b_1$ to $23b_3$, respectively. Materials having different acoustic impedances may be used for the material layers $23a_1$ to $23a_3$ and $23b_1$ to $23b_3$. In this case, combinations of the material layers can facilitate the adjustment of the acoustic impedances $Z_2$ of the reflective layers 23a and 23b.

As is clear from the preferred embodiments and modification described above, the composite-material vibrating device according to the present invention can securely confine vibrations of the vibrating member in regions within the interfaces, since the holding members are coupled to the vibrating member with the reflective layers therebetween and vibrations that have propagated from the vibrating member are reflected at the interfaces between the reflective layers and the corresponding holding members. Thus, the vibration mode of the vibrating member is not particularly limited, and a vibrating member that utilizes various vibration modes can be used, such as a longitudinal mode and width mode, as well as a thickness shear mode and thickness extensional mode.

Not only a piezoelectric resonator but also a piezoelectric filter or other electronic component may be used as the vibrating member, and also another electromechanical coupling conversion element, such as an electrostriction element, may be used as the vibrating member. Alternatively, a vibrating member other than an electromechanical coupling conversion element may also be used.

Figure 15:
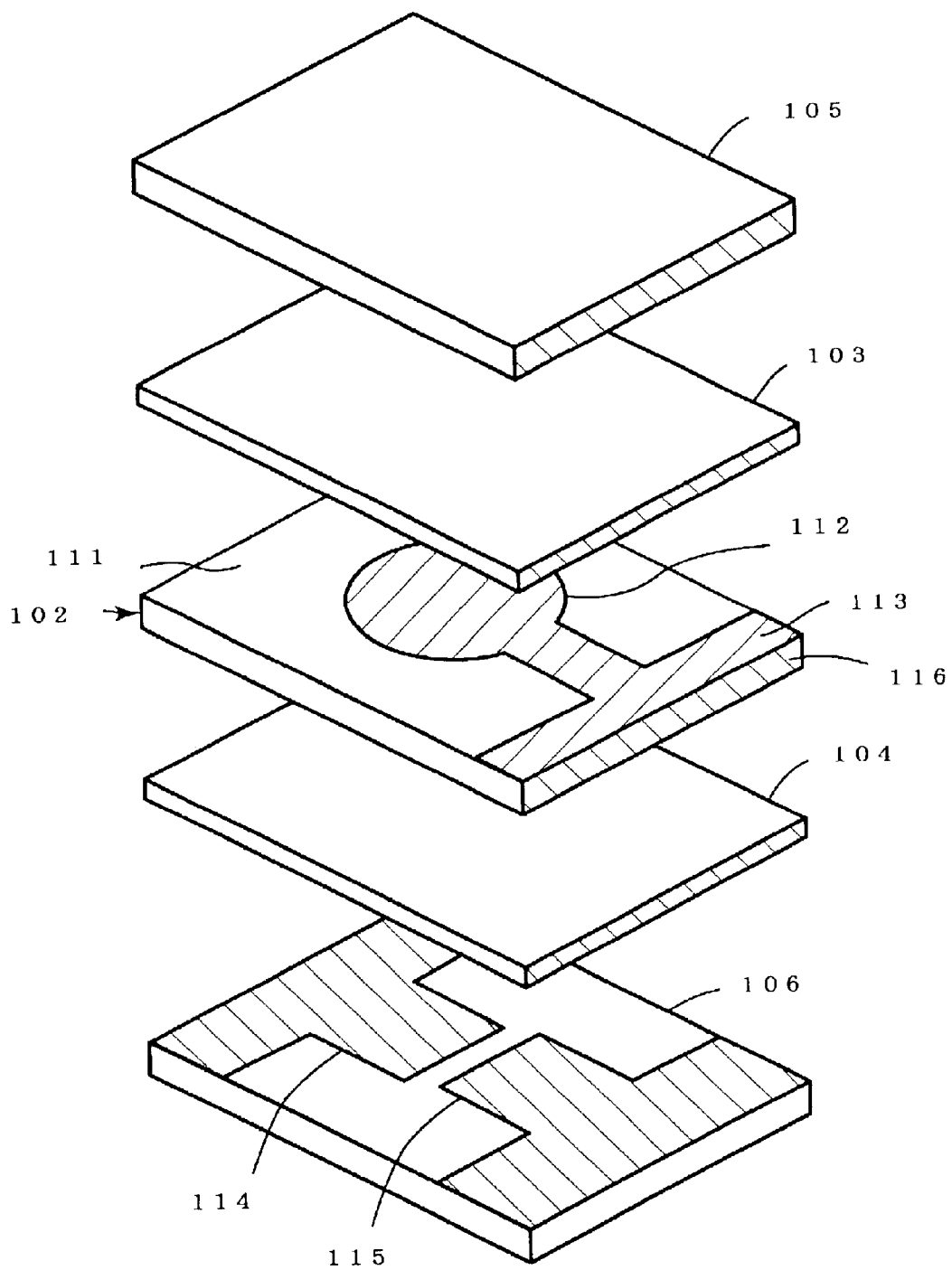
FIG. 15 is an exploded perspective view of a piezoelectric resonator component that is one example of the composite-material vibrating device fabricated according to preferred embodiments of the present invention.
Figure 16:
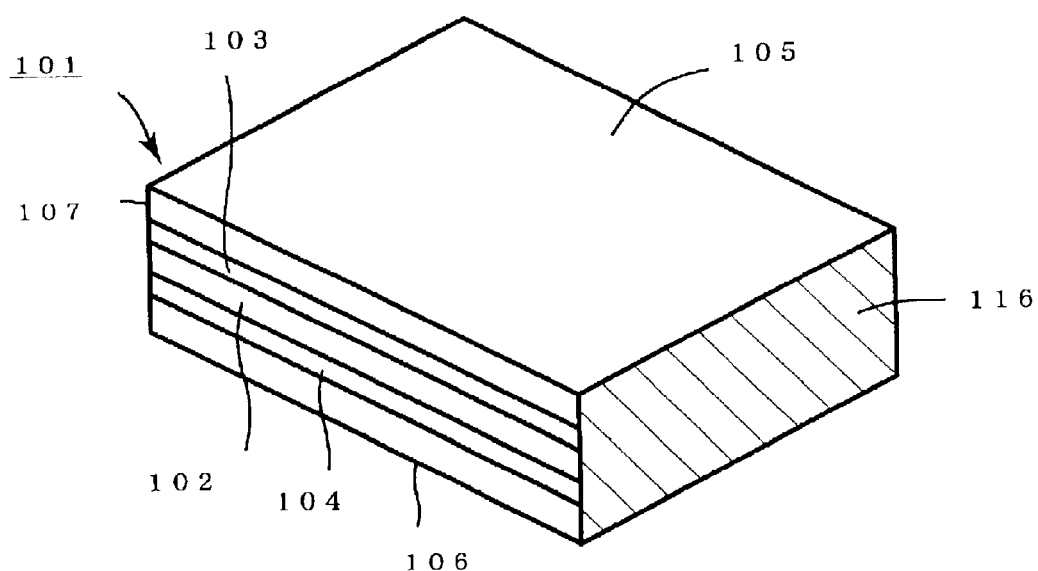
FIG. 16 is a perspective view illustrating the outer appearance of the piezoelectric resonator component that is one example of the composite-material vibrating device fabricated according to preferred embodiments of the present invention.

FIGS. 15 and 16 illustrate a piezoelectric resonator component for use as the composite-material vibrating device fabricated according to the first preferred embodiment of the present invention. FIG. 15 is an exploded perspective view of the piezoelectric resonator component and FIG. 16 is a perspective view of the external appearance thereof.

A piezoelectric resonator component 101 has a vibrating member 102, reflective layers 103 and 104, and holding substrates 105 and 106.

The vibrating member 102 has a substantially rectangular piezoelectric substrate 111. The piezoelectric substrate 111 is made of a piezoelectric ceramic, such as a lead zirconate titanate ceramic, or a piezoelectric single crystal of quartz or the like. A vibrating electrode 112 is provided at the center of the upper surface of the piezoelectric substrate 111. Another vibrating electrode, which is not shown in FIG. 15, is provided at the center of the lower surface of the piezoelectric substrate 11. Upon application of an AC voltage between the vibrating electrode 112 and the vibrating electrode that is provided on the lower surface, the vibrating member 102 operates as a thickness-extensional-vibration-mode piezoelectric resonator.

The vibrating electrode 112 is electrically connected to a lead electrode 113, which is provided along an edge that is defined by one end surface and the upper surface of the piezoelectric substrate 111. The vibrating electrode that is provided on the lower surface is electrically connected to another lead electrode that is arranged so as to reach an edge that is defined by the opposite end surface and the lower surface of the piezoelectric substrate 111.

In this preferred embodiment, the reflective layers 103 and 104 are preferably made of an epoxy resin. The holding substrates 105 and 106 are joined and adhered to the vibrating member 102 using the reflective layers 103 and 104, as described below.

In this preferred embodiment, the holding substrates 105 and 106 are preferably made of a lead zirconate titanate ceramic.

Capacitance electrodes 114 and 115 are provided on the upper surface of one holding substrate 106. A capacitance electrode (not shown) is provided at the approximate center of the lower surface of the holding substrate 106 so as to oppose the capacitance electrodes 114 and 115.

As shown in FIG. 16, the piezoelectric resonator component 101 has a first outer electrode 116 on one end surface. A second outer electrode 117 is provided on the opposing end surface. The outer electrode 116 is electrically connected to the lead electrode 113 and the capacitance electrode 115. The second outer electrode 117 is electrically connected to the capacitance electrode 114 and the lead electrode that is provided on the lower surface of the piezoelectric substrate 111. Thus, the first outer electrode 116, the second outer electrode 117, and the capacitance electrode that is provided on the lower surface of the holding substrate 106 can define terminals used for connection with the outside. This arrangement provides a three-terminal built-in-load-capacitance piezoelectric vibrator in this preferred embodiment.

One of the unique features of the piezoelectric resonator component 101 is that the acoustic impedance $Z_2$ of materials constituting the reflective layers 103 and 104 is preferably smaller than the acoustic impedance of materials constituting the vibrating member, i.e., the acoustic impedance $Z_1$ of materials constituting the piezoelectric substrate 111, and the acoustic impedance $Z_3$ of materials constituting the holding substrates 105 and 106. Thus, even when vibrations, which are generated upon driving of the vibrating member 102, propagate toward the holding substrates 105 and 106 in the reflective layers 103 and 104, the vibrations are reflected at the interfaces between the reflective layers 103 and 104 and the corresponding holding substrates 105 and 106. This will be described with reference to FIG. 17.

Figure 17:
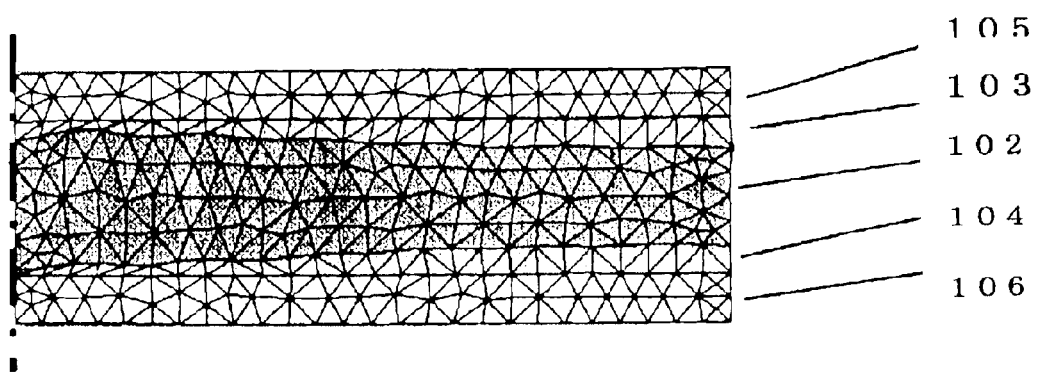
FIG. 17 is a schematic semi-sectional front view illustrating displacement distribution in the piezoelectric resonator component shown in FIG. 16.

FIG. 17 is a schematic semi-sectional front view of the piezoelectric resonator component 101 and shows the distribution of vibration displacement analyzed by a finite element method.

As is clear from FIG. 17, when the piezoelectric resonator component 101 is driven, the vibrating member 102 vibrates, which exhibits displacement, and the reflective layers 103 and 104 also exhibit displacement caused by vibrations that have propagated correspondingly. However, the holding substrates 105 and 106, which are stacked at the outermost ends, exhibit no displacement. This is because the acoustic impedance $Z_2$ is smaller than the acoustic impedances $Z_1$ and $Z_3$ and thus the vibrations that have propagated are reflected at the interfaces, as described above.

Thus, even when the piezoelectric resonator component 101 is mechanically supported by the holding substrate 105 or 106, it is unlikely that the vibration characteristics of the vibrating member 102 are affected.

The present inventor considered the experimental results obtained from the composite-material vibrating device 101 and repeated the experiments while variously changing materials, dimensions, and other characteristics of the piezoelectric resonator 102, the reflective layers 103 and 104, and the holding substrates 105 and 106. As a result, the present inventor discovered that setting the acoustic impedance $Z_2$ of the reflective layers 103 and 104 to be smaller than the acoustic impedance $Z_1$ of the piezoelectric resonator 102 and the acoustic impedance $Z_3$ of the holding substrates 105 and 106 can substantially prevent the propagation of vibrations from the piezoelectric resonator 102 to the holding substrates 105 and 106 as in the experimental example described above. This will now be described with reference to FIGS. 18 and 19.

First, piezoelectric resonator components having various different acoustic impedances ratios $Z_2/Z_1$ were fabricated in such a manner that materials constituting the reflective layers were variously changed in the piezoelectric resonator component 101 of the preferred embodiment described above with the other configurations being the same as those in the preferred embodiment. The resonant frequencies of these piezoelectric resonator components were measured and the rates of resonant frequency change when the acoustic impedance ratios $Z_2/Z_1$ were varied were determined. The result is shown in FIG. 18.

The rate of resonant frequency change is a value expressed by $[(F-F_0)/F_0] \times 100$ (%), where $F_0$ is the resonant frequency of the piezoelectric resonator 102 alone and F is the resonant frequency of each piezoelectric resonator component fabricated as described above.

Figure 18:
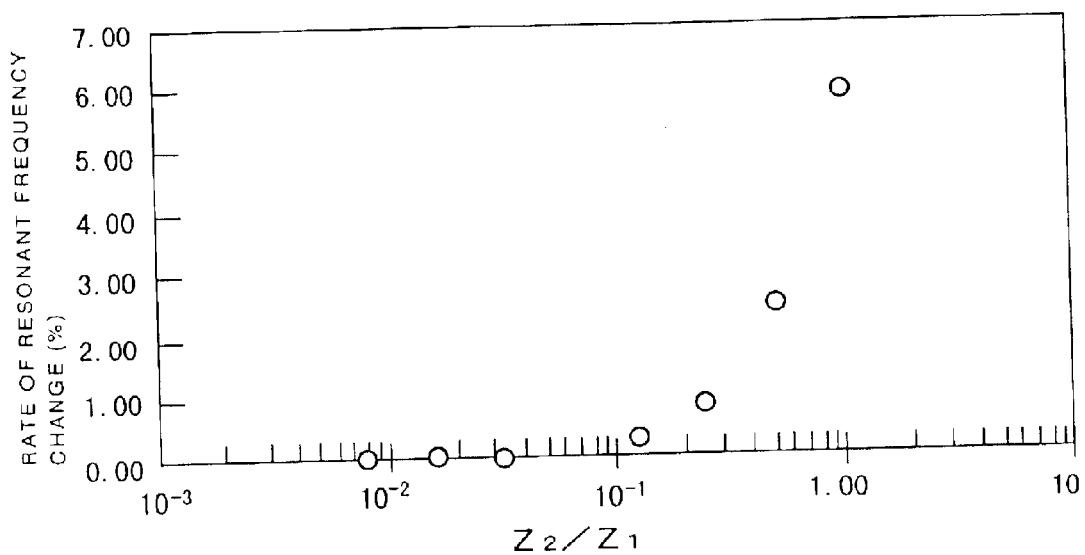
FIG. 18 is a graph showing the rate of resonant frequency change of the composite-material vibrating device of the preferred embodiment when an acoustic impedance ratio $Z_2/Z_1$ is changed.

As is clear from FIG. 18, for an acoustic impedance ratio $Z_2/Z_1$ of less than about 1, the rate of resonant frequency change is small. Preferably, for an acoustic impedance ratio $Z_2/Z_1$ of about 0.2 or less, the ratio of resonant frequency change is very small, i.e., about 0.4% or less, and more preferably, for an acoustic impedance of $Z_2/Z_1$ of about 0.1 or less, the ratio of resonant frequency change is even smaller, i.e., about 0.1% or less.

Next, various piezoelectric resonator components having different acoustic impedances ratios $Z_2/Z_3$ were fabricated in such a manner that materials constituting the holding members were variously changed while the reflective layers were configured as in the preferred embodiment described above in the piezoelectric resonator component of the preferred embodiment. Then, the rates of resonant frequency change were determined in the same manner described above. The result is shown in FIG. 19.

Figure 19:
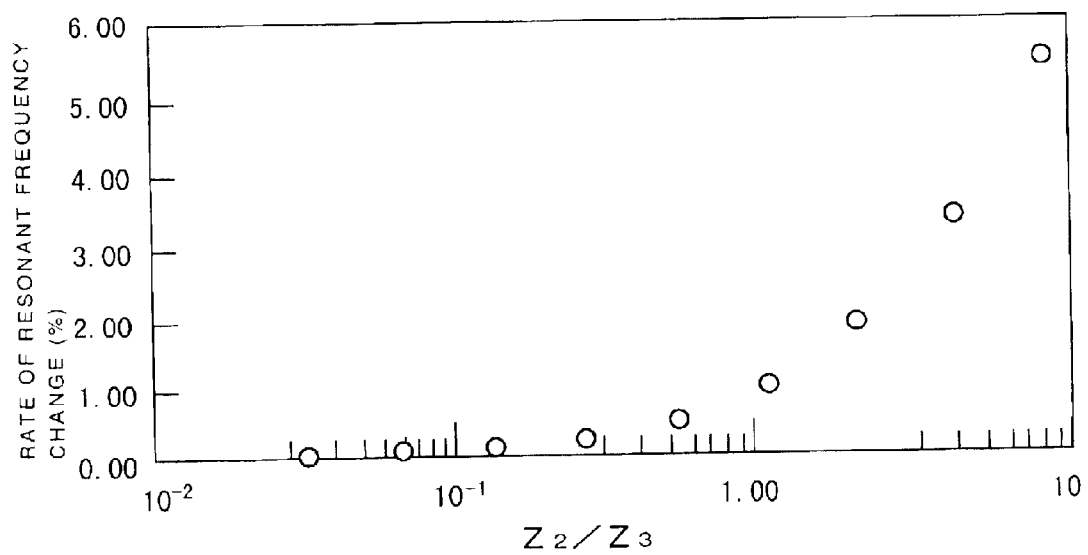
FIG. 19 is a graph showing the rate of resonant frequency change of the composite-material vibrating device of a preferred embodiment when an acoustic impedance ratio $Z_2/Z_3$ is changed.

As is clear from FIG. 19, for an acoustic impedance ratio $Z_2/Z_3$ of less than about 1, the rate of resonant frequency change is small. Preferably, for an acoustic impedance ratio $Z_2/Z_3$ of about 0.2 or less, the rate of resonant frequency change is about 0.215% or less, and more preferably, for an acoustic impedance ratio $Z_2/Z_3$ of about 0.1 or less, the rate of resonant frequency change is about 0.1% or less.

Thus, as is clear from the results shown in FIGS. 18 and 19, the acoustic impedance ratios $Z_2/Z_1$ and $Z_2/Z_3$ are preferably about 0.2 or less and more preferably about 0.1 or less.

The acoustic impedances $Z_2$ of the reflective layers 103 and 104 and the acoustic impedance $Z_3$ of the holding members 105 and 106 can be easily controlled by changing materials constituting the layers and members or the compositions of the materials. For example, while an epoxy resin is used for the reflective layers 103 and 104 in the preferred embodiment described above, an organic or inorganic powder or other suitable material having an acoustic impedance that is different from that of the epoxy resin can be mixed in the epoxy resin to adjust the acoustic impedances $Z_2$ of the reflective layers 103 and 104. In addition, with regard to the holding members 105 and 106, an organic or inorganic powder or other suitable material having an acoustic impedance that is different from that of the ceramic for constituting the holding members 105 and 106 may be mixed in the ceramic to allow easy adjustment of the acoustic impedance $Z_3$.

The materials constituting the reflective layers 103 and 104 and the holding members 105 and 106 are not limited to an epoxy resin and ceramic. Various organic or inorganic materials can be used to provide desired acoustic impedances $Z_2$ and $Z_3$.

Meanwhile, fabrication of the piezoelectric resonator component 101 requires high-accuracy control of the thickness of the reflective layers 103 and 104. That is, when thicknesses of the reflective layers 103 and 104 vary, the distance from the upper surface of the vibrating member 102 to the interface between the reflective layer 103 and the holding substrate 105 and the distance from the lower surface of the vibrating member 102 to the interface between the reflective layer 104 and the holding substrate 106 vary. This makes it difficult to ensure that the vibrations that have propagated are reflected at the interfaces back toward the vibrating member 102, which can impair the characteristics of the piezoelectric resonator component 101.

Further, other preferred embodiments of the present invention provide a fabrication method that allows the high-accuracy control of the thickness of the reflective layers 103 and 104 in such a composite-material vibrating device.

Figure 14A:
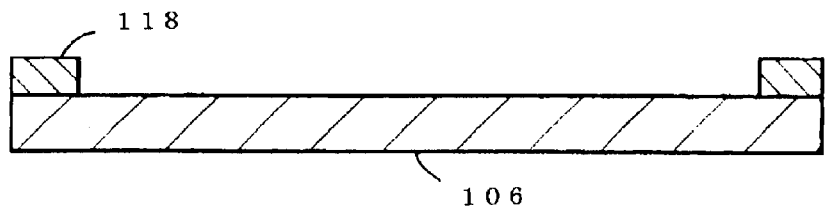
FIGS. 14A to 14C each are a front sectional view illustrating a fabrication method according to one preferred embodiment of the present invention.
Figure 14B:
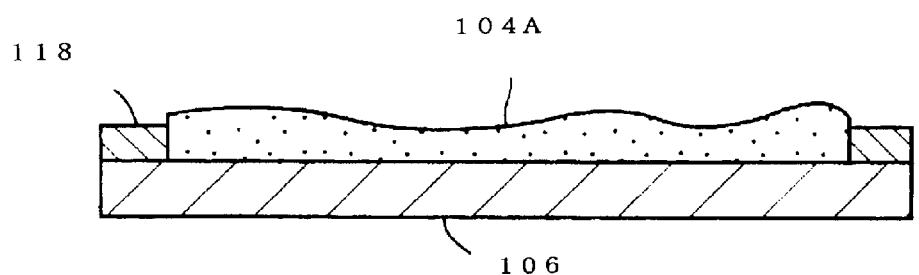
Figure 14C:
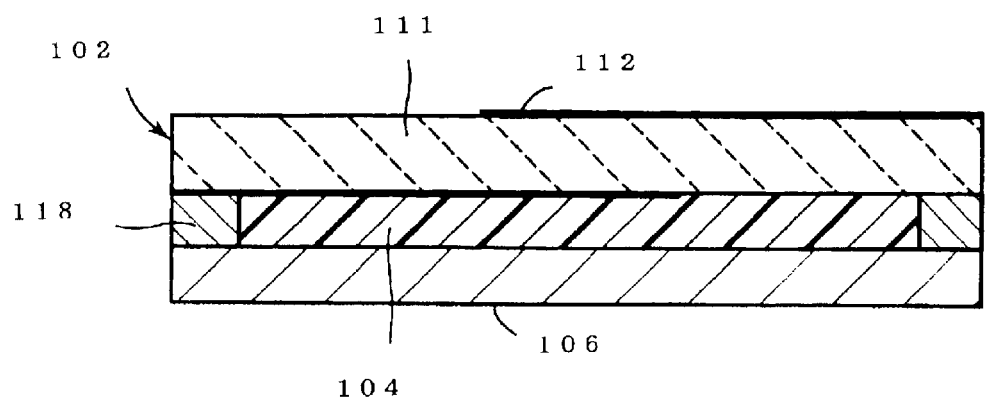

FIGS. 14A, 14B, and 14C each are a front sectional view illustrating a fabrication method according to another preferred embodiment of the present invention.

To provide the piezoelectric resonator component 101, first, the vibrating member 102 and the holding substrates 105 and 106 are prepared. The vibrating member 102 preferably uses the substantially rectangular piezoelectric substrate 111 having a first acoustic impedance $Z_1$, and the holding substrates 105 and 106 have a third acoustic impedance $Z_3$. As shown in FIG. 14A, a strip protrusion 118 is formed on one holding substrate 106. In FIGS. 14A, 14B, and 14C, it is to be noted that the capacitance electrodes 114 and 115 and the capacitance electrode that is provided on the lower surface of the holding substrate 106 are not shown.

In this preferred embodiment, the strip protrusion 118 is constituted of a member that is different from the holding substrate 106 and has a substantially rectangular frame shape in plan view. The strip protrusion 118 has the same thickness as that of the reflective layer 104, which is provided by adhesion.

Material that constitutes the strip protrusion 118 is not particularly limited, but preferably is the same material as that of the holding substrate 106 to which the strip protrusion 118 is fixed. The strip protrusion 118 is integrally laminated to the holding substrate 106 by adhesion or other suitable material.

Alternatively, the strip protrusion 118 and the holding substrate 106 may be integrally configured using the same material.

Next, as shown in FIG. 14B, a fluid material 104A is applied to the holding substrate 106. The fluid material 104A is a material that becomes the reflective layer 104 after being curing. In this preferred embodiment, an epoxy resin is preferably used for the fluid material 104A.

After the fluid material 104A is applied in a region surrounded by the strip protrusion 118, the vibrating member 102 is placed on the fluid material 104A and the fluid material 104A is cured by ultraviolet radiation, heat application, or other suitable process. The reflective layer 104, shown in FIG. 14C, is provided as described above. The formation of the reflective layer 104 causes the holding substrate 106 and the vibrating member 102 to be laminated together.

In addition, similarly, a strip protrusion is formed on the lower surface of the holding substrate 105, which is separately provided, and after a fluid material is applied thereto, the holding substrate 105 is laminated to the upper surface of the vibrating member 102. In the manner described above, a laminate is provided in which the reflective layers 103 and 104 and the holding substrates 105 and 106 are laminated to the corresponding upper and lower surfaces of the vibrating member 102.

Forming outer electrodes on opposing end surfaces of the laminate that has been obtained as described above can provide the same structure as that of the piezoelectric resonator component 101. The piezoelectric resonator component 101, though, was not provided with the strip protrusion 118. In contrast, in this preferred embodiment, the strip protrusion 118 is used to thereby allow the application region of the fluid material 104A to be restricted, and the thickness of the strip protrusion 118 is used to allow the control of thickness of the fluid material 104A to be applied. This ensures the formation of the reflective layers 103 and 104 having a thickness as desired.

Figure 20A:
FIGS. 20A to 20C each are a front sectional view illustrating a fabrication method according to another preferred embodiment of the present invention.
Figure 20B:
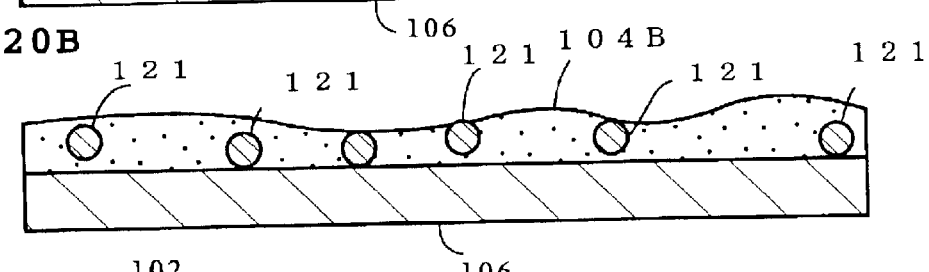
Figure 20C:
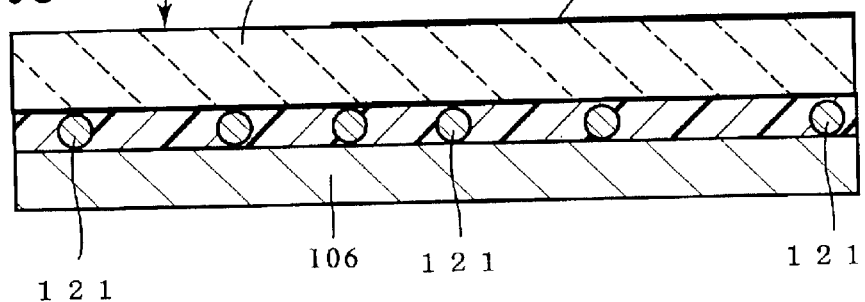

FIGS. 20A to 20C each are a front sectional view illustrating a fabrication method according to a second preferred embodiment of the present invention and correspond to FIGS. 14A to 14C, respectively.

In the second preferred embodiment as well, first, the vibrating member 102 and the holding substrates 105 and 106 are prepared. As shown in FIGS. 20A and 20B, a fluid material 104B containing a spherical or columnar substance is applied to the holding substrate 106. The fluid material 104B containing a spherical or columnar substance is a material in which a spherical or columnar substance 121 is dispersed in an epoxy resin. The spherical or columnar substance 121 is not limited to a particular material as long as it is a spherical or columnar solid. It is, however, required that material for the spherical or columnar substance 121 and the ratio of addition to the fluid material 104B be selected to satisfy the condition that the acoustic impedance $Z_2$ is smaller than the acoustic impedances $Z_1$ and $Z_3$.

The size of the spherical or columnar substance 121 is preferably substantially equal to the thickness of the intended reflective layer 104.

Next, the vibrating member 102 is laminated to the fluid material 104B containing a spherical or columnar substance and the fluid material 140B is cured. During the lamination, the vibrating member 102 is pressed against the holding substrate 106 such that the thickness of the fluid material 104B is substantially the same as the size of the spherical or columnar substance 121. Thus, the reflective layer 104, which is formed by the cured fluid material 104B, has a thickness that is substantially the same as the size of the spherical or columnar substance 121. Thus, controlling the size of the spherical or columnar substance 121 can facilitate the provision of the reflective layer having a desired thickness.

In the second preferred embodiment, similarly, the fluid material containing a spherical or columnar substance is applied to the vibrating member 102, the holding substrate 105 is laminated thereto, and the fluid material is cured to form the reflective layer 103.

In the second preferred embodiment, the thickness of the reflective layer 104 is controlled by the size of the spherical or columnar substance 121. This can eliminate the need for the strip protrusion 118 that is prepared in the first preferred embodiment. Thus, according to the second preferred embodiment, merely applying the fluid material 104B to the holding substrate or the vibrating member 102, laminating the resulting structure to the vibrating member 102 or the holding substrate, and curing the fluid material 104B can ensure the formation of the reflective layers 103 and 104 having a desired thickness.

FIGS. 21A to 21D each are a front sectional view illustrating a fabrication method according to a third preferred embodiment of the present invention.

Figure 21A:
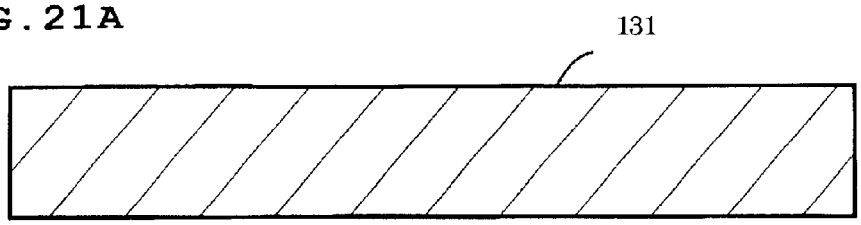
FIGS. 21A to 21D each are a front sectional view illustrating a fabrication method according to yet another preferred embodiment of the present invention.

As shown in FIG. 21A, first, a holding substrate 131 is prepared.

Figure 21B:
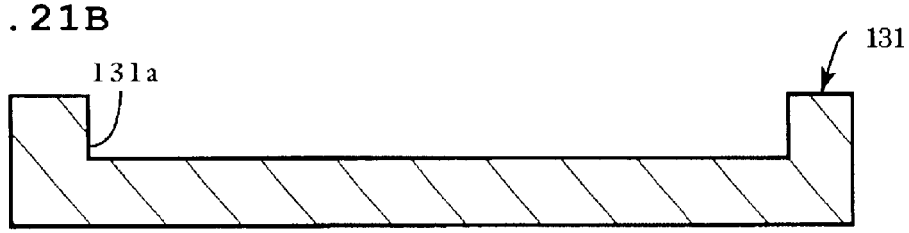

Next, as shown in FIG. 21B, a depression 131a is formed in the upper surface of the holding substrate 131. The depression 131a preferably has a substantially rectangular shape in plan view. The depth of the depression 131a is preferably substantially the same as the thickness of an intended reflective layer. The depression 131a is formed by, for example, machining.

Figure 21C:
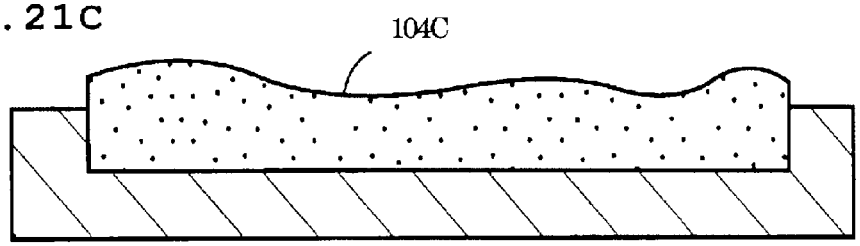
Figure 21D:
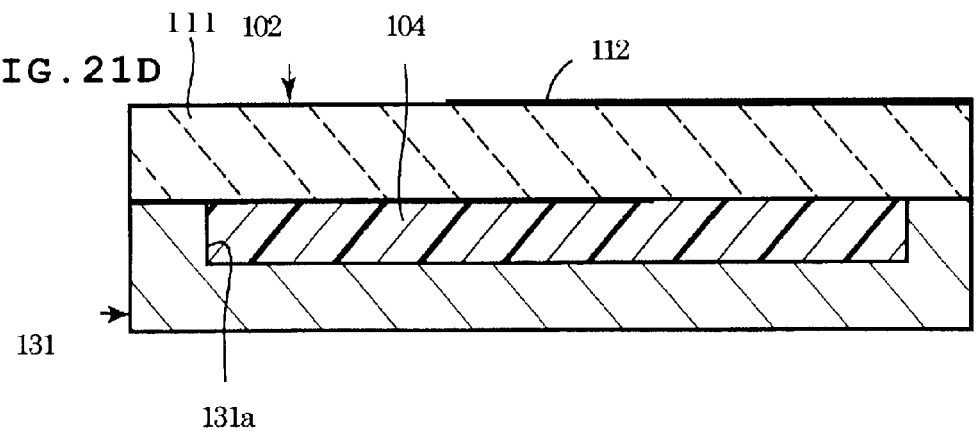

Subsequently, as shown in FIG. 21C, a fluid material 104C is applied in the depression 131a. The fluid material 104C is a material that ultimately becomes the reflective layer 104. Thereafter, as shown in FIG. 21D, the vibrating member 102 is laminated to the holding substrate 131. Excessive fluid material 104C is removed from the inside of the depression 131a by pressure applied during the lamination. As a result, after being curing, the reflective layer 104 having a thickness equal to the thickness of the depression 131 is formed. As described above, a structure in which the vibrating member 102 is laminated to the holding substrate 131 via the reflective layer 104 is provided. Similarly, with respect to the structure above the vibrating member 102, another holding substrate in which a depression is formed is laminated to the vibrating member 102 using the fluid material. This can provide a laminate in which the holding substrates are laminated to the vibrating members via the reflective layers, as in the first and second preferred embodiments.

In the third preferred embodiment, the thickness of the reflective layer is controlled by the depth of the depression 131a. Thus, as in the first and second preferred embodiments, the third preferred embodiment can ensure the formation of the reflective layer having a desired thickness.

Figure 22A:
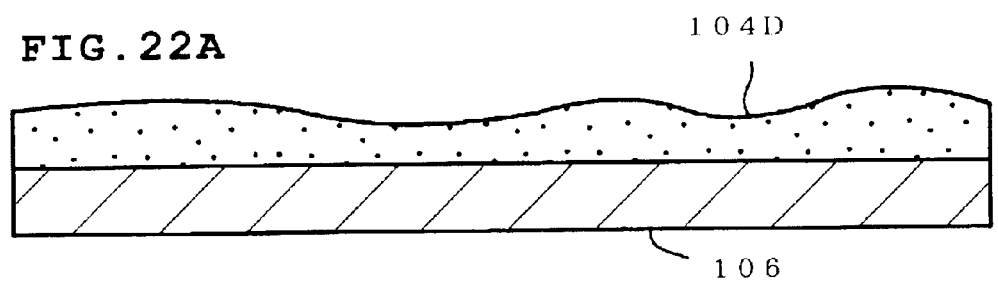
FIGS. 22A to 22C each are a front sectional view illustrating a fabrication method according to yet another preferred embodiment of the present invention.
Figure 22B:
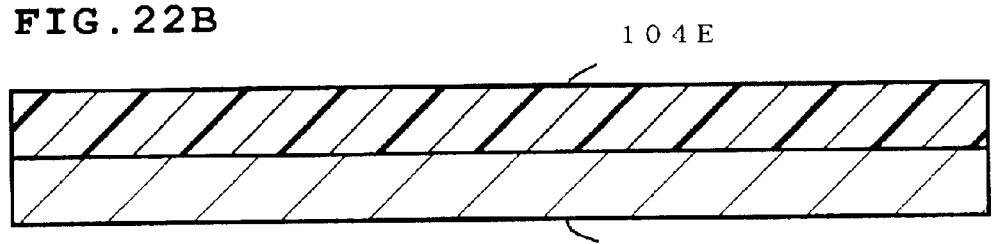
Figure 22C:
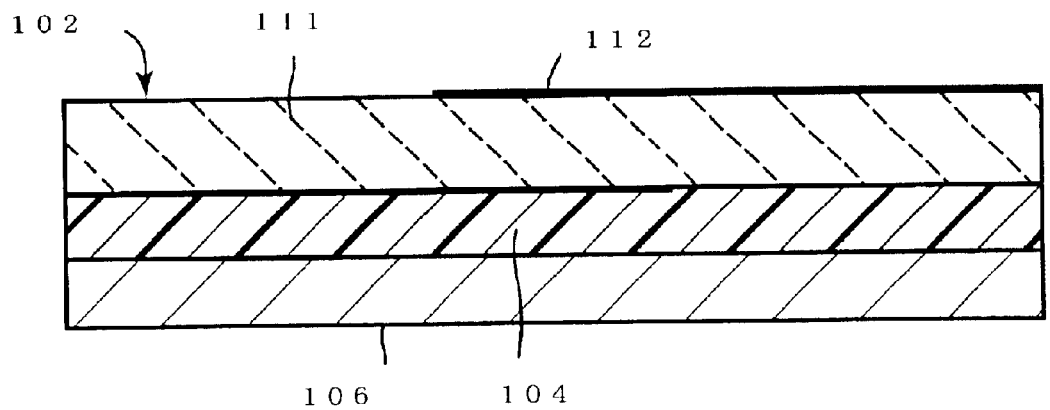

FIGS. 22A to 22C each are a front sectional view illustrating a fabrication method according to a fourth preferred embodiment of the present invention.

In the fourth preferred embodiment, first, the vibrating member 102 and the holding substrates 105 and 106 are prepared, as in the first to third preferred embodiments. A fluid material 104D is then applied to the holding substrate 106. The thickness of the fluid material 104D to be applied is selected such that the thickness thereof after application is greater than a desired thickness of the reflective layer 104.

Thereafter, as shown in FIG. 22B, the fluid material 104D is cured to provide a reflective layer 104E. The thickness of the reflective layer 104E is preferably greater than the thickness of an intended reflective layer. Thus, the reflective layer 104E is processed by machining, such as sandblasting, until the thickness thereof reaches a desired thickness. Such thickness processing provides the reflective layer 104 having a desired thickness as shown in FIG. 22C. Thereafter, the vibrating member 102 is laminated to the reflective layer 104 using an adhesive (not shown). In the same manner, a reflective layer is formed on the vibrating member 102 and the holding member 105 is laminated to the reflective layer using an adhesive.

Thus, since the thickness processing described above allows the control of the thickness of the reflective layers, the fourth preferred embodiment can also provide a piezoelectric resonator component that is improved in accuracy of the thickness of the reflective layers.

Figure 23A:
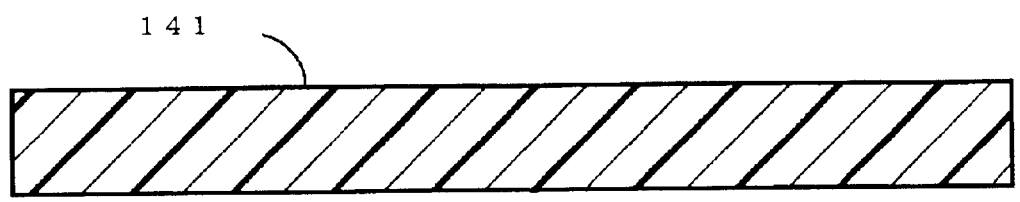
FIGS. 23A to 23C each are a front sectional view illustrating a fabrication method according to still another preferred embodiment of the present invention.
Figure 23B:
Figure 23C:
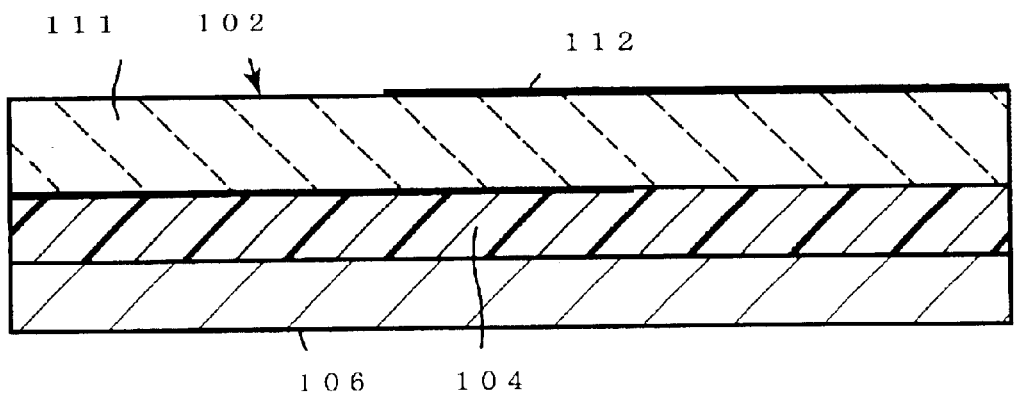

FIGS. 23A to 23C each are a front sectional view illustrating a fabrication method according to a fifth preferred embodiment of the present invention. In this preferred embodiment, first, not only the vibrating member 102 and the holding substrates 105 and 106 but also a reflective-layer-constituent material 141 shown in FIG. 23A is prepared. The reflective-layer-constituent material 141 is preferably made of material in the form of a thick plate having a thickness greater than the thickness of the intended reflective layer 104.

Next, the reflective-layer-constituent material 141 is machined to provide the reflective layer 104 having a desired thickness as shown in FIG. 23B.

Thereafter, as shown in FIG. 23C, the holding substrate 106 and the vibrating member 102 are laminated together with the reflective layer 104 interposed therebetween, using an adhesive (not shown). Similarly, the reflective layer 103 having a desired thickness is prepared in advance and the upper holding substrate 105 is also laminated to the vibrating member 102 with the reflective layer 103 interposed therebetween, using an adhesive (not shown).

Thus, in the fifth preferred embodiment, the reflective layers 103 and 104 that are prepared are machined in advance to have a desired thickness.

Figure 24:
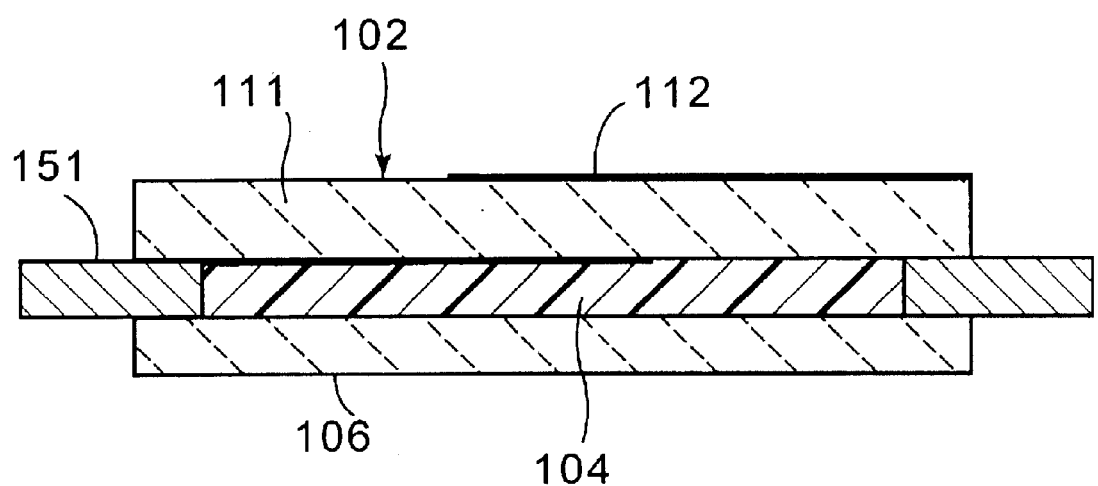
FIG. 24 is a front sectional view illustrating a fabrication method according to still another preferred embodiment of the present invention.

FIG. 24 is a schematic front sectional view illustrating a fabrication method according to a sixth preferred embodiment of the present invention.

The sixth preferred embodiment corresponds to a modification of the first preferred embodiment. While the strip protrusion 118 is arranged on the holding substrate 106 so that the fluid material 104A is applied therein in the first preferred embodiment, a spacer 151, which corresponds to the strip protrusion 118, may be arranged on the holding substrate 106, as shown in FIG. 24. In this case, a fluid material is applied in the resulting depression, the vibrating member 102 is laminated to the resulting structure, and the fluid material is cured to thereby provide the reflective layer 104. As with the strip protrusion 118, the thickness of the spacer 151 is preferably the same as the thickness of the final reflective layer 104.

The spacer 151 is removed after the fluid material is cured.

In this manner, instead of the strip protrusion 118, the spacer 151, which is ultimately removed, may be used to control the thickness of the reflective layer 104.

As described above, since the reflective layers 103 and 104 having a desired thickness can be reliably formed, any one of the first to sixth preferred embodiments can provide the piezoelectric resonator component 101 that has improved accuracy of the distance from the vibrating member to the interfaces between the reflective layers and the corresponding holding substrates.

When a fluid material that becomes the reflective layers 103 and 104 is applied and cured, bubbles may be trapped therein. This is because bubbles can be trapped as the fluid material is spread. Of the preferred embodiments described above, the embodiments in which the strip protrusion 118 and the depression 131a are formed can prevent the trapping of such bubbles. Thus, even when the applied fluid material is spread during the lamination, the bubble trapping is more likely to occur at the periphery. Thus, when the strip protrusion 118 or the depression 131a is formed, bubbles are trapped only in the vicinity of the inner surface of the strip protrusion 118 or the depression 131a. That is, portions in which bubbles are trapped are unevenly distributed at the periphery. Thus, when individual laminates, each having a piezoelectric resonator component, are cut out from a mother laminate in which a mother vibrating member is laminated to mother holding substrates 105 and 106 with mother reflective layers 103 and 104 interposed therebetween, it is less likely that bubbles are generated at the cross sections. Generation of bubbles at the cross sections causes a decrease in the accuracy of forming outer electrodes and/or adversely affects the vibration characteristics. Thus, preferably, the strip protrusion, depression, or spacer is used to control the thickness of the reflective layer. Such an arrangement can desirably suppress the generation of air gaps at cross sections.

While descriptions of the above-described preferred embodiments have been directed to methods for fabricating the piezoelectric resonator component 101 or the piezoelectric resonator component having a structure similar to the piezoelectric resonator component 101, the present invention is appropriately applicable to a method for fabricating a composite-material vibrating device having a structure in which a vibrating member is laminated to holding substrates with reflective layers therebetween. Thus, the vibrating member is not limited to an electromechanical coupling conversion element, such as a piezoelectric element or electrostriction element, and thus may be another vibration generating source.

In the present invention, a thin-film forming method is not used to form the reflective layers, and the reflective layers 103 and 104 are preferably formed so as to have a certain thickness of about 3 $\mu$m or more. Accordingly, mechanical support using the holding substrates has little influence on the vibration characteristics of the vibrating member.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A composite-material vibrating device comprising:
   a vibrating member including a material having a first acoustic impedance $Z_1$ and defining a vibration generating source;
   at least three reflective layers coupled to corresponding outer surfaces located in at least three directions of the vibrating member and including a material having a second acoustic impedance $Z_2$ that is smaller than the first acoustic impedance $Z_1$; and holding members coupled to surfaces opposite to the surfaces, coupled to the vibrating member, of the reflective layers, and including a material having a third acoustic impedance $Z_3$ that is greater than the second acoustic impedance $Z_2$;

wherein vibrations that have propagated from the vibrating member to the reflective layers are reflected at interfaces between the reflective layers and the corresponding holding members.

2. A composite-material vibrating device according to claim 1, wherein the vibrating member has one of a substantially rectangular parallelepiped shape and a substantially cubic shape and the reflective layers are provided on at least three outer surfaces of the vibrating member.

3. A composite-material vibrating device according to claim 1, wherein the ratio $Z_2/Z_1$ of the second acoustic impedance $Z_2$ to the first acoustic impedance $Z_1$ is about 0.2 or less.

4. A composite-material vibrating device according to claim 1, wherein the ratio $Z_2/Z_3$ of the second acoustic impedance $Z_2$ to the third acoustic impedance $Z_3$ is about 0.2 or less.

5. A composite-material vibrating device according to claim 1, wherein propagating vibrations that propagate in the reflective layers from the vibrating member toward the holding members are reflected at the interfaces between the reflective layers and the corresponding holding members, and the amplitude direction of the propagating vibrations is substantially perpendicular to the propagating direction of the propagating vibrations.

6. A composite-material vibrating device according to claim 1, wherein the vibrating member includes an electro-mechanical coupling conversion element.

7. A composite-material vibrating device according to claim 6, wherein the electromechanical coupling conversion element includes one of a piezoelectric element and an electrostriction element.

8. A composite-material vibrating device according to claim 1, wherein each of the reflective layers includes a plurality of material layers having different acoustic impedances.

9. A composite-material vibrating device according to claim 1, wherein the distance from the interfaces between the reflective layers and the vibrating member to the interfaces between the reflective layers and the corresponding holding members is in the range of about $n \cdot \lambda/4 \pm \lambda/8$, where n is an odd number and $\lambda$ is the wavelength of propagating vibrations that propagate in the reflective layers toward the holding members in response to vibrations from the vibrating member.

10. A composite-material vibrating device according to claim 1, wherein the holding members have a plurality of capacitance electrodes for constituting a capacitor.

11. A composite-material vibrating device according to claim 1, wherein the composite-material vibrating device is a three-terminal built-in-capacitance piezoelectric resonator.

12. A composite-material vibrating device according to claim 1, wherein the vibrating member includes a piezoelectric resonator.

13. A composite-material vibrating device according to claim 12, wherein the piezoelectric resonator is substantially rectangular.

14. A composite-material vibrating device according to claim 12, wherein the piezoelectric resonator, the reflective layers, and the holding members constitute an elongated strip structure.

15. A composite-material vibrating device according to claim 1, wherein the reflective layers are made of epoxy resin.

16. A composite-material vibrating device according to claim 1, further comprising excitation electrodes provided on each of an upper surface and a lower surface of the vibrating member and extending to edges of the vibrating member.

17. A composite-material vibrating device according to claim 1, wherein the holding members have a substantially rectangular plate shape.

18. A composite-material vibrating device according to claim 16, wherein a protection film made of an insulating resin is stacked on an upper surface of the vibrating member with the excitation electrodes disposed thereon.

19. A composite-material vibrating device according to claim 1, wherein the vibrating member includes a piezoelectric resonator having no vibration-permitting cavity therein.

20. A composite-material vibrating device according to claim 1, wherein the vibrating member includes a piezoelectric resonator that vibrates in one of a longitudinal mode, a width mode, a thickness shear mode and a thickness extensional mode.

* * * * *